United States Patent
Kim

(10) Patent No.: US 11,138,136 B2
(45) Date of Patent: Oct. 5, 2021

(54) SYSTEM AND METHOD FOR ROUTING BUS INCLUDING BUFFER

(71) Applicant: Samsung Electronics Co., Ltd., Suwon-si (KR)

(72) Inventor: Byung-yong Kim, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/776,755

(22) Filed: Jan. 30, 2020

(65) Prior Publication Data

US 2020/0167296 A1    May 28, 2020

Related U.S. Application Data

(63) Continuation of application No. 15/617,117, filed on Jun. 8, 2017, now Pat. No. 10,579,554.

(30) Foreign Application Priority Data

Oct. 20, 2016    (KR) .................. 10-2016-0136576

(51) Int. Cl.
*G06F 13/16*    (2006.01)
*G06F 30/392*    (2020.01)
(Continued)

(52) U.S. Cl.
CPC ...... *G06F 13/1673* (2013.01); *G06F 13/1657* (2013.01); *G06F 13/4282* (2013.01); *G06F 15/7821* (2013.01); *G06F 30/392* (2020.01); *G06F 30/394* (2020.01); *G06F 2213/16* (2013.01)

(58) Field of Classification Search
USPC ....................................................... 716/126
See application file for complete search history.

(56) References Cited

U.S. PATENT DOCUMENTS 6,069,490 A    5/2000  Ochotta et al.
6,145,116 A    11/2000 Tawada
(Continued)

FOREIGN PATENT DOCUMENTS

KR    20130125036 A    11/2013
TW     201603027 A    1/2016
(Continued)

OTHER PUBLICATIONS

Taiwanese Office Action dated Jan. 15, 2021, corresponding to Taiwanese Patent Application No. 106129230.

*Primary Examiner* — Mohammed Alam
(74) *Attorney, Agent, or Firm* — Harness, Dickey & Pierce, P.L.C.

(57) ABSTRACT

Program procedures executed to rout a bus, via a processing unit, include a bus information extractor configured to extract bus information including physical requirements for the bus, from input data, a buffer array generator configured to generate a buffer array in which buffers included in the bus are regularly arranged based on the bus information, a buffer array placer configured to place at least one buffer array in the layout of the integrated circuit based on the bus information, and a wiring procedure configured to generate interconnections connected to buffers included in the at least one buffer array based on the bus information.

17 Claims, 22 Drawing Sheets

(51) Int. Cl.
*G06F 30/394* (2020.01)
*G06F 13/42* (2006.01)
*G06F 15/78* (2006.01)

(56) References Cited

U.S. PATENT DOCUMENTS

| | | | |
|---|---|---|---|
| 6,678,645 B1 | 1/2004 | Rajsuman et al. | |
| 7,207,022 B2 | 4/2007 | Okudaira | |
| 8,060,849 B2 | 11/2011 | He et al. | |
| 8,688,428 B2 | 4/2014 | Hotta | |
| 9,111,592 B2 | 8/2015 | Maejima | |
| 9,311,437 B2 | 4/2016 | Clark et al. | |
| 9,312,837 B2 | 4/2016 | Bhatia | |
| 2004/0227205 A1* | 11/2004 | Walmsley | G06F 21/575 |
| | | | 257/499 |
| 2004/0256638 A1* | 12/2004 | Perego | G06F 13/1684 |
| | | | 257/200 |
| 2009/0063529 A1 | 3/2009 | Gustavson et al. | |
| 2009/0063607 A1 | 3/2009 | Gustavson et al. | |
| 2010/0074038 A1* | 3/2010 | Ruckerbauer | G11C 7/1084 |
| | | | 365/200 |
| 2010/0162186 A1 | 6/2010 | Shah | |
| 2013/0054854 A1 | 2/2013 | Li et al. | |
| 2013/0305078 A1 | 11/2013 | Lee et al. | |
| 2014/0082248 A1 | 3/2014 | Shaikh et al. | |
| 2015/0026431 A1 | 1/2015 | Vorbach et al. | |
| 2016/0117435 A1 | 4/2016 | Lee et al. | |
| 2018/0113820 A1* | 4/2018 | Kim | G06F 15/7821 |

FOREIGN PATENT DOCUMENTS

| | | |
|---|---|---|
| TW | 201611022 A | 3/2016 |
| TW | 201621326 | 6/2016 |

* cited by examiner

FIG. 4

```
     *Bus Information

10   BUS_1{
11        Start_Point:        * input/output pin of cells  ⎤ G1
12        Destination_Point:  * input/output pin of cells  ⎦
13        Buffer_Type:        * inverting or non-inverting ⎤
14        Buffer_Strength:    * drive strength             ⎥
15        Configuration:      * # of rows & # of columns   ⎥
16        Position_of_Clock:  * row# & column#             ⎬ G2
17        Array_Space:        * distance between arrays    ⎥
18        Layers:             * layer index                ⎦
          ...
     }

50   BUS_2{
          ...
     }
```

D200

SYSTEM AND METHOD FOR ROUTING BUS INCLUDING BUFFER

CROSS-REFERENCE TO RELATED APPLICATION

This application is a continuation of application Ser. No. 15/617,117, filed Jun. 8, 2017, which claims the benefit of priority from Korean Patent Application No. 10-2016-0136576, filed on Oct. 20, 2016, in the Korean Intellectual Property Office, the entire contents of each of which are incorporated herein by reference.

BACKGROUND

The inventive concepts relate to an integrated circuit, and/or to a system and method for routing a bus in an integrated circuit.

A digital integrated circuit such as a system-on-chip (SoC) may include various function blocks. With the advances in semiconductor process technology, the number of devices included in function blocks has increased, and operating speeds of the function blocks have also increased. An integrated circuit may include a bus for facilitating communication between function blocks.

SUMMARY

In order to enhance the performance of function blocks, a bus structure included in an integrated circuit may be advantageous. The inventive concepts provide a method of routing a bus in an integrated circuit and/or a system and method for routing a bus including a buffer, in an integrated circuit.

According to an example embodiment, a computing system for routing a bus including a buffer in a layout of an integrated circuit, the computing system including a memory configured to store information including program procedures, and a processing unit configured to access the memory and execute the program procedures, wherein the program procedures includes a bus information extractor configured to extract bus information including physical requirements, alternatively referred to as physical characteristics, for the bus from input data, a buffer array generator configured to generate a buffer array in which buffers included in the bus are regularly arranged, based on the bus information, a buffer array placer configured to place at least one buffer array in the layout of the integrated circuit, based on the bus information, and a wiring procedure configured to generate interconnections connected to buffers included in the at least one buffer array, based on the bus information.

According to an example embodiment, there is provided a method of routing a bus including a buffer in a layout of an integrated circuit, the method being performed on a computing system and including extracting bus information including physical requirements for the bus from input data, generating a buffer array in which buffers included in the bus are regularly arranged, based on the bus information, placing at least one buffer array in the layout of the integrated circuit, based on the bus information, and generating interconnections connected to buffers included in the at least one buffer array, based on the bus information.

Example embodiments relate to a system for routing a bus in an integrated circuit, the system including at least one bus having physical requirements and including a plurality of buffer arrays, and a plurality of function blocks connected to each other via the at least one bus, each of the plurality of function blocks being configured to receive data to be processed or to transmit processed data via the at least one bus, the plurality of buffers included in the at least one bus being regularly spaced based on the physical requirements, and the plurality of buffers being interconnected in the buffer array based on the physical requirements.

BRIEF DESCRIPTION OF THE DRAWINGS

Example embodiments will be more clearly understood from the following detailed description taken in conjunction with the accompanying drawings in which:

FIG. 4 illustrates bus information extracted using a bus information extractor of FIG. 3, according to an example embodiment;

DETAILED DESCRIPTION

These and other features and advantages are described in, or are apparent from, the following detailed description of various example embodiments.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under the another layer or one or more intervening layers may also be present. In addition, it will also be understood that when a layer is referred to as being "between" two layers, it can be the only layer between the two layers, or one or more intervening layers may also be present.

Figure 1:
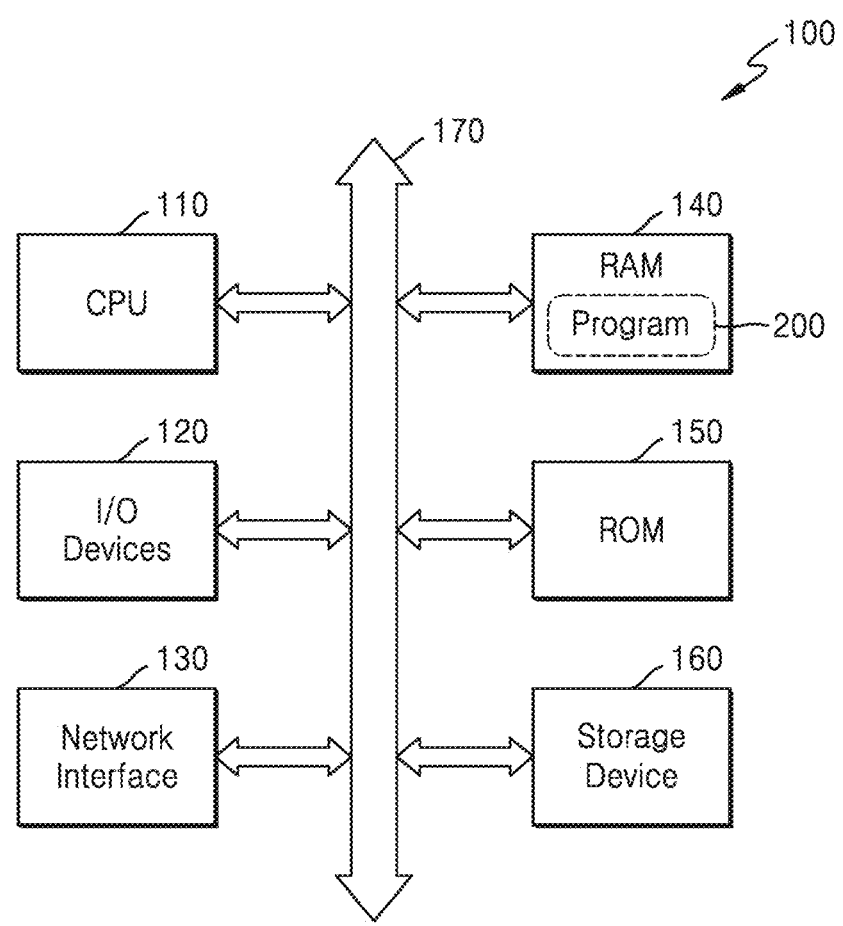
FIG. 1 is a block diagram of a computing system including a memory storing a program, according to an example embodiment.

FIG. 1 is a block diagram of a computing system 100 including memory storing a program, according to an example embodiment. An operation of routing a bus in a layout of an integrated circuit according to an example embodiment may be performed in the computing system 100.

The computing system 100 may be a fixed-type computing system such as a desktop computer, a workstation, a server or a portable computing system such as a laptop computer. As illustrated in FIG. 1, the computing system 100 may include a central processing unit (CPU), input/output devices 120, a network interface 130, a random access memory (RAM) 140, a read only memory (ROM) 150, and a storage device 160. The CPU 110, the input/output devices 120, the network interface 130, the RAM 140, the ROM 150, and the storage device 160 may be connected to a bus 170 and communicate with one another via the bus 170.

The CPU 110 may be referred to as a processing unit, and may be, for example, a micro-processor, an application process (AP), a digital signal processor (DSP), which includes a core that executes an instruction set (e.g., IA-32 (Intel Architecture-32), IA-32 for 64-bit extension, x86-64, PowerPC, Sparc, MIPS, ARM, and IA-64). For example, the CPU 110 may access a memory, that is, the RAM 140 or the ROM 150, via the bus 170 and execute instructions stored in the RAM 140 or the ROM 150. As illustrated in FIG. 1, the RAM 140 may store all or at least a portion of a program 200 according to an example embodiment. The program 200 may instruct the CPU 110 to perform an operation of routing a bus. That is, the program 200 may include a plurality of instructions executable by the CPU 110, and the plurality of instructions included in the program 200 may be used to instruct the CPU 110 to perform operations of routing a bus according to example embodiments.

The storage device 160 may not lose stored data even when a power supply to the computing system 100 is blocked. For example, the storage device 160 may include a non-volatile memory such as an Electrically Erasable Programmable Read-Only Memory (EEPROM), a flash memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (FRAM) or a storage medium such as a magnetic tape, an optical disk, or a magnetic disk. In addition, the storage device 160 may be detachable from the computing system 100. The storage device 160 may store the program 200 according to the example embodiment, and the whole or at least a portion of the program 200 may be loaded from the storage device 160 to the RAM 140 before executing the program 200 by using the CPU 110. Alternatively, the storage device 160 may store files written in programming language, and the whole or at least a portion of the program 200 generated from the file by using a compiler may be loaded to the RAM 140.

The storage device 160 may store data to be processed by the CPU 110 or data that is processed by the CPU 110. That is, the CPU 110 may generate, according to the program 200, data by processing data stored in the storage device 160, and store the generated data in the storage device 160. For example, the storage device 160 may store input data D100 of FIG. 3 processed according to the program 200, or store output data D900 of FIG. 3 generated according to the program 200.

The input/output devices 120 may include an input device such as a keyboard or a pointing device and an output device such as a display device and a printer. For example, by using the input/output devices 120, a user may trigger execution of the program 200 via the CPU 110, input the input data D100 of FIG. 3, or check output data D900 of FIG. 3 or an error message.

The network interface 130 may provide access to an external network of the computing system 100. For example, the network interface 130 may include a plurality of computing systems and communication links, and the communication links may include wired links, optical links, wireless links or links in other forms.

Figure 2:
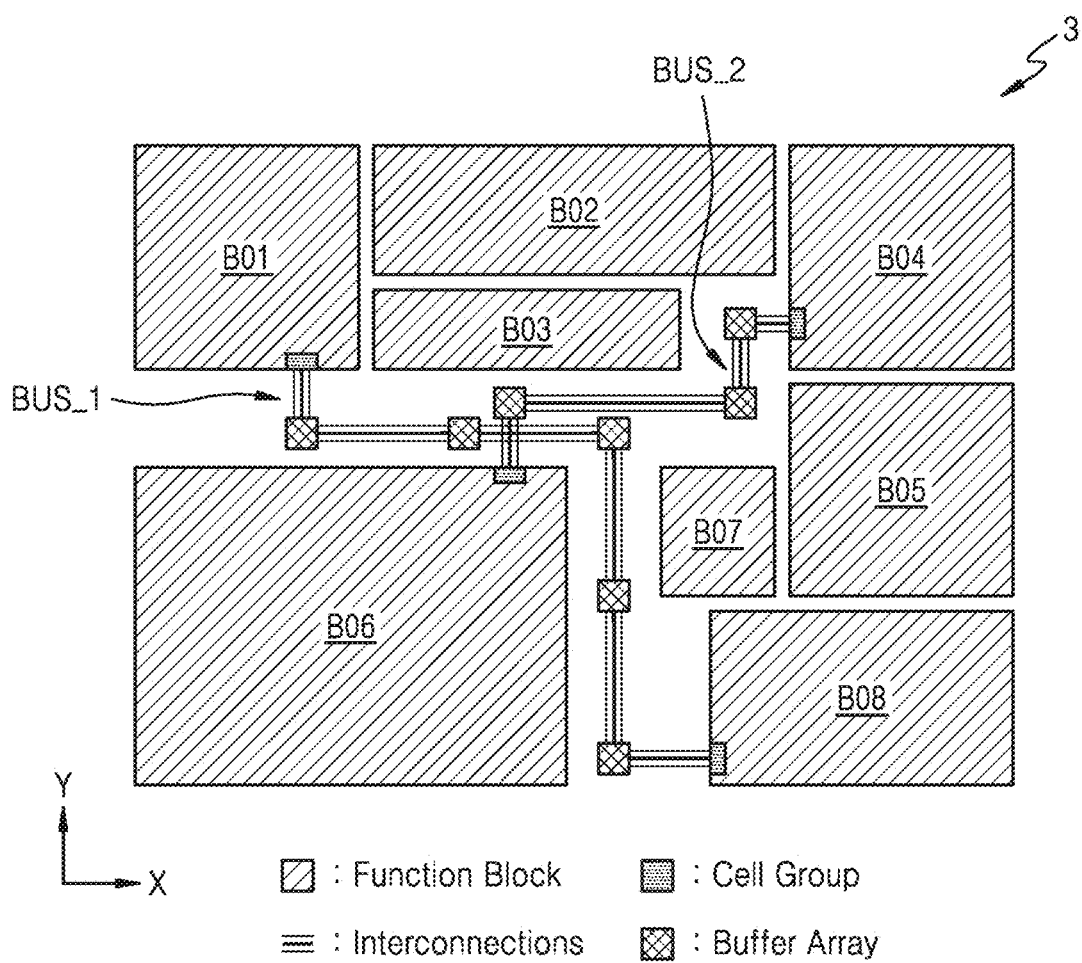
FIG. 2 is a schematic plan view of an integrated circuit according to an example embodiment.

FIG. 2 is a schematic plan view of an integrated circuit 3 according to an example embodiment. For convenience of description, sizes of elements in the integrated circuit 3 of FIG. 2 may not be according to scale and may be magnified or reduced.

As illustrated in FIG. 2, the integrated circuit 3 may include first through eighth function blocks B01 through B08. A function block may refer to a circuit unit that processes a digital signal and may be, for example, a processor (e.g., a microprocessor, a graphic processor or a digital signal processor), a memory (e.g., a dynamic RAM (DRAM) or a static RAM (SRAM)) or a controller (e.g., a Direct Memory Access (DMA) controller or a Universal Serial Bus (USB) controller). Each, or at least one, of the function blocks B01 through B08 may be designed to perform a desired, or alternatively predetermined functional in the integrated circuit 3 and placed as illustrated in FIG. 2.

The function blocks B01 through B08 may receive data to be processed or transmit processed data, via a bus. For example, as illustrated in FIG. 2, the first function block B01 and the eighth function block B08 may communicate with each other via a first bus BUS_1, and the fourth function block B04 and the sixth function block B06 may communicate with each other via a second bus BUS_2. In detail, the first bus BUS_1 may be connected to each pin of a cell group included in the first function block B01 and each, or at least one, of pins of a cell group included in the eighth function block B08. Similarly, the second bus BUS_2 may be connected to each, or at least one, of pins of a cell group included in the fourth function block B04 and each, or at least one, of pins of a cell group included in the sixth function block B06.

As performance of the function blocks B01 through B08 included in the integrated circuit 3 is enhanced, buses such as the first bus BUS_1 and the second bus BUS_2 may be designed to have a great bandwidth. For example, a bus may have, without limitation, an Advanced High-performance bus (AHB) structure or a structure for a Network-on-Chip (NoC) structure. A bandwidth of a bus may increase as a bus width, that is, the number of connections included in a bus increases and/or a frequency of signals transmitted through the bus is increased. A connection may refer to a path through which a signal is transmitted from a pin of a cell group included in a function block, from which the signal departs, to a pin of a cell group included in another function block, at which the signal arrives. A bus may include a plurality of connections to transmit signals corresponding to a plurality of bits in parallel and transmit a clock signal. As the number and/or an area of function blocks included in the integrated circuit 3 increases, the longer may be a length of a bus connected between the function blocks. In addition, as a frequency of a signal transmitted through a bus increase, signals transmitted through the bus are more likely to be distorted. Accordingly, a bus may include a plurality of buffers to ensure signal integrity, and the buffers may be serially connected for one connection.

According to an example embodiment, in a method of routing a bus, which may be performed in the computing system 1 of FIG. 1, a bus may be routed by placing a buffer array generated based on quantified physical requirements of the bus. That is, instead of independently routing connections included in a bus, the connections included in the bus may be routed based on the quantified physical requirements of the bus, and a buffer array in which a plurality of buffers are regularly arranged may be used. For example, as illustrated in FIG. 2, the first bus BUS_1 may include five buffer arrays and interconnections connected to the buffer arrays, and the second bus BUS_2 may include three buffer arrays and interconnections connected to the buffer arrays. In the present specification, routing of a bus or a connection may refer to an operation of determining a physical structure of a bus in a layout of an integrated circuit (for example, the integrated circuit 3 of the FIG. 3), by using routing resources, and an interconnection may refer to an equipotential structure including a pattern and/or a via formed in a wiring layer (e.g., a metal layer).

In order to fulfil a timing requirement of a signal (e.g., delay or jitter) that travels from a starting point to an arrival point via a connection (as will be described later with reference to FIG. 11A), if connections included in a bus are individually routed and buffers included in the connections are also individually placed, jitter of signals transmitted in parallel may increase, and moreover, routing resources such as buffers, wiring layers, and vias may be wasted. According to the method of routing a bus according to an example embodiment, which will be described below with reference to the drawings, bus connections may be uniformly routed by using a buffer array, and routing resources used in bus routing may be reduced. In addition, crosstalk between signals may be reduced, thereby providing greater signal integrity.

Figure 3:
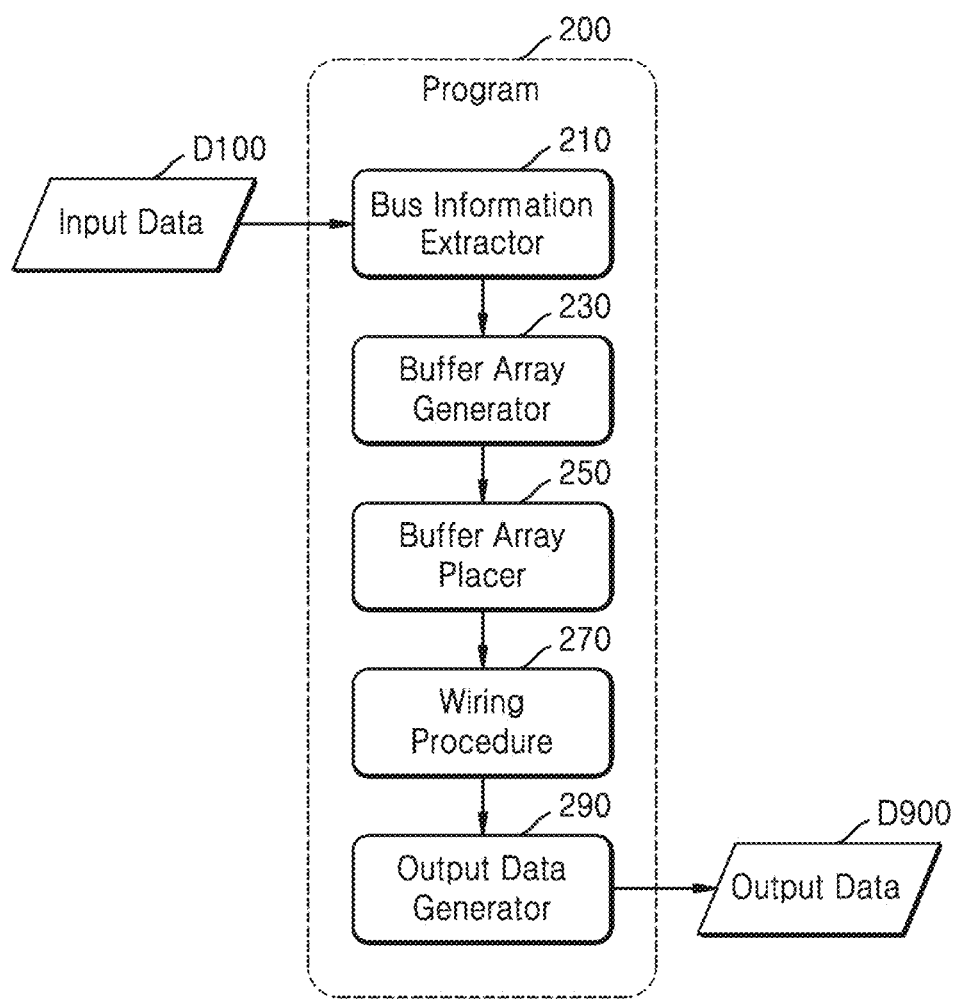
FIG. 3 is a block diagram of a program of FIG. 1 according to an example embodiment.

FIG. 3 is a block diagram of the program 200 of FIG. 1 according to an example embodiment. As described above with reference to FIG. 1, the program 200 may include a plurality of instructions, and the plurality of instructions included in the program 200 may allow the CPU 110 to perform an operation of routing a bus according to an example embodiment. FIG. 3 illustrates a schematic block diagram of the program 200 together with the input data D100 and the output data D900.

Referring to FIG. 3, the program 200 may include a plurality of procedures 210, 230, 250, 270, and 290. A procedure may refer to a series of instructions for performing a desired, or alternatively predetermined task. A procedure may also be referred to as a functional, a routine, a subroutine, or a subprogram. Each procedure may process input data (e.g., the input data D100) or output data of other procedures. In the present specification, when it is described that the CPU 110 of FIG. 1 performs an operation by executing a procedure, for example, one of the procedures 210, 230, 250, 270, and 290, it may also be understood that the procedure, that is, one of the procedures 210, 230, 250, 270, and 290, is performed so that the operation is executed.

A bus information extractor 210 may extract bus information including physical requirements for a bus, from the input data D100. The input data D100 may include information for routing a bus in an integrated circuit (e.g., the integrated circuit 3 of FIG. 3). For example, the input data D100 may include data indicating a layout of an integrated circuit having a format such as a GDSII, and may include at least one bus list file listing specifications of buses to be added to the integrated circuit. In addition, the input data D100 may include information set by a user via the input/output devices 120 of FIG. 1. The bus information extractor 210 may generate bus information including physical requirements by extracting physical requirements of a bus needed to rout a bus, from the input data D100. For example, physical requirements of a bus may include information about a starting point and an arrival point of the bus and channel area information about a channel area where the bus may be placed. According to an example embodiment, the bus information extractor 210 may further extract, from the input data D100, information about a signal transmitted via a bus, for example, a voltage level, a frequency, and a rising time and a falling time of a signal. As will be described later with reference to FIG. 4, requirements for routing a bus may be quantified based on bus information extracted using the bus information extractor 210, and the bus information may provide a basis for subsequently executed procedures for performing a bus routing operation.

A buffer array generator 230 may generate a buffer array based on the bus information extracted using the bus information extractor 210. A buffer array may include a plurality of buffers that are regularly arranged. A buffer array may include buffers of a number corresponding to the number of connections included in a bus, and the buffers included in the buffer array may be the same or different in structure. In addition, a form in which buffers are arranged in a buffer array, that is, a configuration of a buffer array, may be various as illustrated in examples of FIGS. 5A through 5C.

Types of buffers included in a buffer array and/or configurations of buffer arrays may be pre-set based on bus information, or may be determined by using the buffer array generator 230 based on physical requirements included in bus information. For example, bus information may include physical requirements that define types of buffers included in a buffer array and buffer array configurations, and the buffer array generator 230 may generate buffer arrays included in each, or at least one, of two or more buses based on bus information about the two or more buses. In addition, the buffer array generator 230 may differently generate two or more buffer arrays included in a bus. As will be described later, as a bus includes a buffer array generated using the buffer array generator 230, bus connections may be uniformly routed, and crosstalk between different buses may also be reduced.

A buffer array placer 250 may place at least one buffer array generated using the buffer array generator 230, in a layout of an integrated circuit. That is, the buffer array placer 250 may place instances of a buffer array generated using the buffer array generator 230 in a layout of an integrated circuit. For example, the buffer array placer 250 may place buffer arrays such that distances between adjacent buffer arrays are uniform in a bus, or may place buffer arrays at turning points of the bus. In addition, when the buffer array generator 230 has generated two or more different buffer arrays with respect to one bus, the buffer array placer 250 may place the different buffer arrays according to locations for placing the buffer arrays. For example, as illustrated in FIG. 2, among the five buffer arrays included in the first bus BUS_1, three buffer arrays that are placed at turning points of the bus may be different from the other two buffer arrays. That is, the buffer array placer 250 may select a buffer array to be placed, according to directions of interconnections connected to the buffer array.

A wiring procedure 270 may generate interconnections connected to buffers included in at least one buffer array placed using the buffer array placer 250. The more vias through which signals pass, are included in an interconnection, that is, as the number of times a signal passes through different wiring layers, disadvantages such as Maximum Transition Time Violation (MTTV) caused by increased resistance in an interconnection may occur, and routing sources may be wasted. The buffer arrays placed using the buffer array placer 250 may be placed such that simple interconnections are formed between adjacent buffer arrays, and accordingly, the wiring procedure 270 may generate interconnections with simpler structures, that is, interconnections including a reduced number of vias. In addition, bus information extracted using the bus information extractor 210 may include physical requirements that restrict routing resources in order to ensure integrity of signals transmitted through a bus. For example, physical requirements included in bus information may define wiring layers in which interconnections of a bus may be formed and vias which may be included in the interconnections of the bus. The wiring procedure 270 may form simplified interconnections as described above, and thus, may easily fulfil the physical requirements restricting routing resources.

An output data generator 290 may generate output data D900 including physical information about buffers of a buffer array and interconnections. For example, the output data D900 may include names of standard cells corresponding to buffers included in a buffer array and coordinates information of buffers. As another example, the output data D900 may also include information indicating a layout of buffers included in a buffer array and information indicating a layout of interconnections. The output data D900 may be used in implementing a bus through a semiconductor process. For example, sub-processes included in a semiconductor process may be designed based on the output data D900, and a mask to be used in a sub-process may be manufactured.

FIG. 4 illustrates bus information D200 extracted using the bus information extractor 210 of FIG. 3, according to an example embodiment. As described above with reference to FIG. 4, the bus information D200 may include physical requirements of a bus, extracted from the input data D100, by using the bus information extractor 210. The bus information D200 of FIG. 4 is merely an example of bus information generated using the bus information extractor 210 of FIG. 1, and bus information generated using the bus information extractor 210 of FIG. 1 may not include some of the physical requirements illustrated in FIG. 4 or may further include physical requirements not illustrated in FIG. 4. In FIG. 4, for convenience of description, examples of physical requirements that may be included in bus information and forms of values of the physical requirements are illustrated, and actual values of the physical requirements are omitted.

The bus information D200 may include bus information about at least one bus. For example, as illustrated in FIG. 4, the bus information D200 may include bus information about the first bus BUS_1 and the second bus BUS_2. The bus information about the first bus BUS_1 and the bus information about the second bus BUS_2 may include identical physical requirements, and corresponding physical requirements of the first bus BUS_1 and the second bus BUS_2 may have identical or different values.

Referring to FIG. 4, physical requirements included in the bus information about the first bus BUS_1 may include a requirement group G1 and an optional requirement group G2. Physical requirements included in the requirement group G1 are indispensable to rout a bus, and may include, for example, physical requirements for a starting point and an arrival point of a bus as illustrated in FIG. 4 (e.g., lines 11 and 12 of FIG. 4). The physical requirements for a starting point and an arrival point may include, for example, coordinates information of the starting point and the arrival point and layer information. Referring to FIG. 4, the physical requirements for the starting point and the arrival point may include pin information of cells connected through a bus. The bus information extractor 210 may output an error message through the input/output devices 120 of FIG. 1 or the like if a physical requirement included in the requirement group G1 is not defined in the input data D100, that is, if a value of a physical requirement included in the requirement group G1 is not to be set based on the input data D100.

The physical requirements included in the optional requirement group G2 may refer to physical requirements that are not indispensable to routing a bus but define a routing condition. For example, as illustrated in FIG. 4, the optional requirement group G2 may include physical requirements (that is, lines 13 through 18 of FIG. 4) for a buffer type, a driving intensity of a buffer, a buffer array configuration, a location of a clock buffer in a buffer array, a distance between buffer arrays, and layers of interconnections. In detail, the physical requirement for a buffer type (the line 13 of FIG. 4) may have an inverting or non-inverting value, and the physical requirement for the driving intensity of a buffer (the line 14 of FIG. 4) may have a value indicating an index about a driving intensity of an output signal provided by standard cells. The physical requirement for a buffer array configuration (the line 15 of FIG. 4) may have values indicating the number of rows and columns of a buffer array, and the physical requirement for a location of a clock buffer (the line 16 of FIG. 4) may have values indicating row numbers and column numbers of a buffer array, at which a clock buffer is to be located. The physical requirement for a distance between buffer arrays (the line 17 of FIG. 4) may have a value indicating a distance between buffer arrays, and the physical requirement for layers of interconnections (the line 18 of FIG. 4) may have a value indicating an index of wiring layers that may be used in interconnections.

According to an example embodiment, the bus information extractor 210 of FIG. 3 may set, as a default, a physical requirement that is not set in the input data D100 of FIG. 3, from among the physical requirements included in the optional requirement group G2. Default values of the physical requirements included in the optional requirement group G2 may be pre-set and include a "don't care" value. For example, if the physical requirement for a buffer type (the line 13 of FIG. 4) is not defined in the input data D100, the bus information extractor 210 may set a value of the physical requirement for a buffer type (the line 13 of FIG. 4) to a value indicating a non-inverting value. In addition, if the physical requirement for a buffer array configuration (the line 15 of FIG. 4) is not defined in the input data D100, the bus information extractor 210 may set a value of the physical requirement for a buffer type (the line 15 of FIG. 4) to "don't care."

As illustrated in FIG. 4, by using the bus information D200 in which physical requirements for a bus are quantified, a buffer array may be generated, and the generated buffer array may be placed, and a wiring operation may be performed. As a designer of an integrated circuit inputs at least one of the physical requirements included in the optional requirement group G2 in the input data D100, the designer may obtain a bus structure that is adaptively routed according to the program 200 of FIG. 3.

Figure 5A:
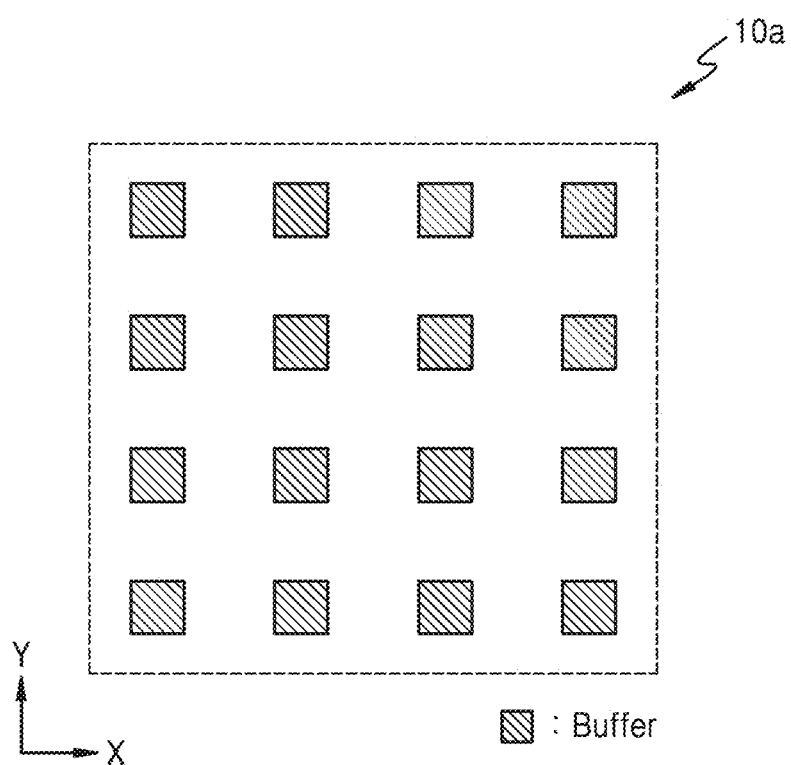
FIGS. 5A through 5C schematically illustrate examples of buffer arrays generated using a buffer array generator of FIG. 3, according to example embodiments.
Figure 5B:
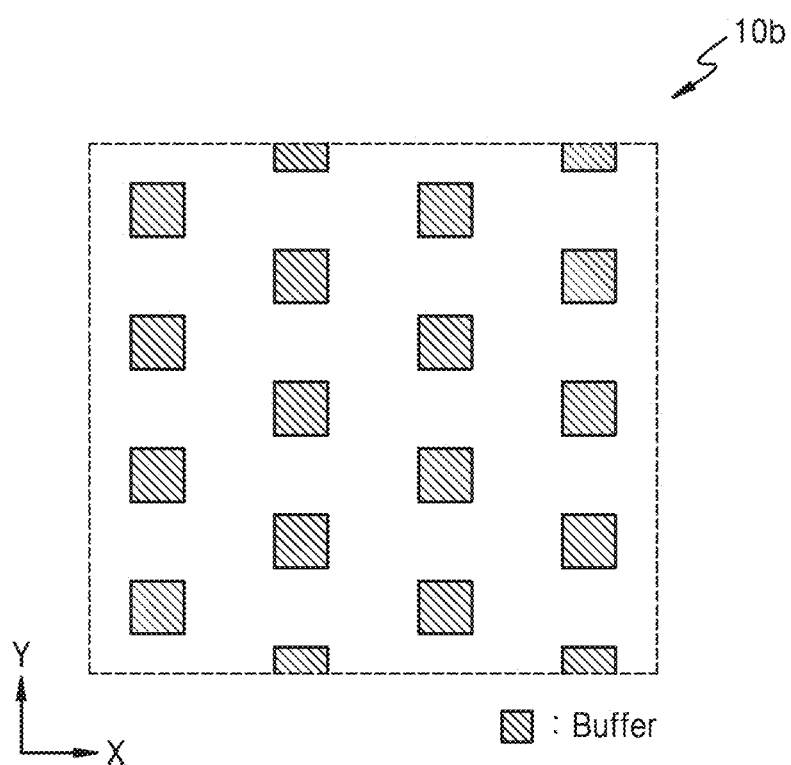
Figure 5C:
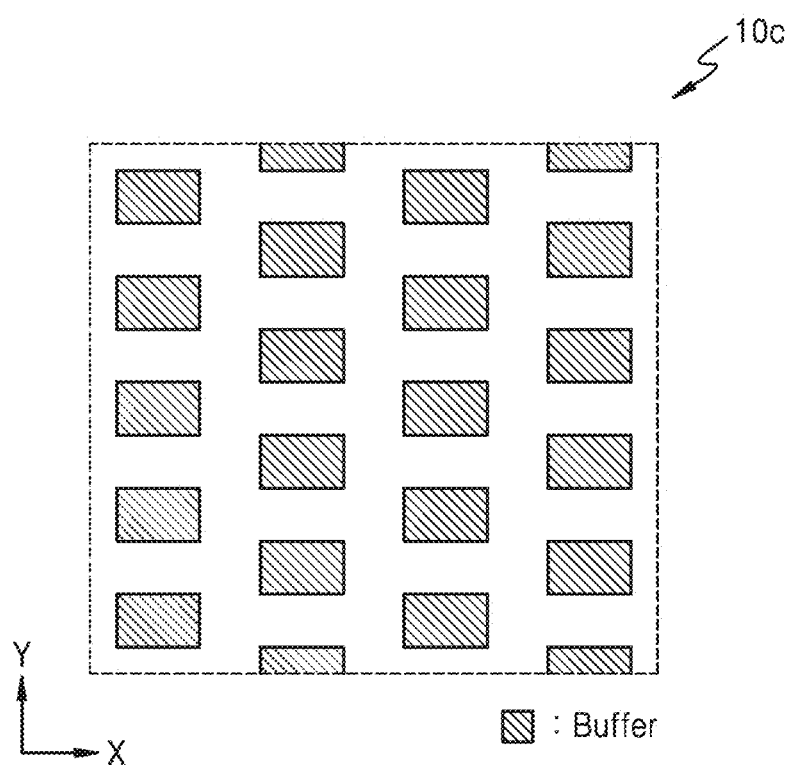

FIGS. 5A through 5C schematically illustrate examples of buffer arrays generated using the buffer array generator 230 of FIG. 3, according to example embodiments. As described above with reference to FIG. 3, the buffer array generator 230 may generate a buffer array based on bus information generated using the bus information extractor 210. FIGS. 5A through 5C respectively illustrate a portion of a buffer array, and it will be understood that the buffer array generated using the buffer array generator 230 may include a different number of buffers from those of FIGS. 5A through 5C or may include differently placed buffers from those of FIGS. 5A through 5C.

The buffer array generator 230 may generate a buffer array including regularly placed buffers. For example, as illustrated in FIG. 5A, the buffer array generator 230 may generate a buffer array 10a in which adjacent buffers are aligned in an X-axis direction and a Y-axis direction. In addition, as illustrated in FIGS. 5B and 5C, the buffer array generator 230 may generate a buffer array 10b or 10c in which adjacent buffers are aligned in a Y-axis direction.

Buffers of the buffer arrays generated using the buffer array generator 230 may have different densities. For example, in the case of equal inner areas within a dotted line in FIGS. 5A through 5C, the buffer array 10a of FIG. 5A and the buffer array 10b of FIG. 5B may include sixteen buffers, and the buffer array 10c of FIG. 5C may include twenty buffers. The lower a density of buffers included in a buffer array, the greater a distance between interconnections connected to the buffers, and accordingly, crosstalk between the interconnections may be reduced. Accordingly, based on these characteristics, as will be described later with reference to FIG. 9, the buffer array generator 230 may determine a configuration of a buffer array based on signal characteristics of signals transmitted through a bus.

Figure 6:
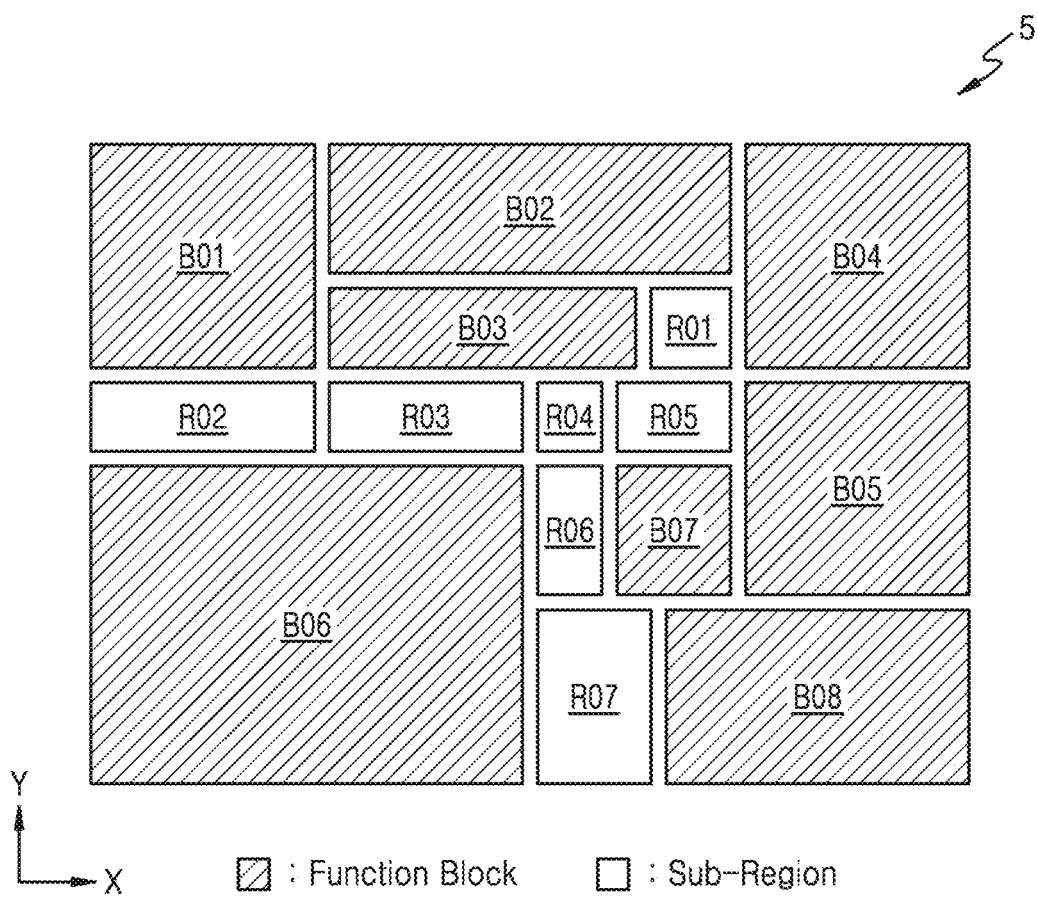
FIG. 6 is a schematic plan view of an integrated circuit according to an example embodiment.

FIG. 6 is a schematic plan view of an integrated circuit 5 according to an example embodiment. In detail, the integrated circuit 5 of FIG. 6 corresponds to the integrated circuit of FIG. 2 except for not including a bus.

As illustrated in FIG. 6, the integrated circuit 5 including function blocks B01 through B08 may include sub-regions (or channel sub-regions) R01 through R07 available for a bus. For example, the sub-regions R01 through R07 may correspond to regions that are obtained by dividing a region, in which the function blocks B01 through B08 are not placed (that is, a channel region), along edges of the function blocks B01 through B08. A bus connected to two or more function blocks may be placed in a region including at least one of the sub-regions R01 through R07. For example, when referring to FIGS. 2 and 6 together, the first bus BUS_1 of FIG. 2 may be placed in the sub-regions R02, R03, R04, R06, and R07 of FIG. 6, and the second bus BUS_2 of FIG. 2 may be placed in the sub-regions R03, R04, R05, and R01 of FIG. 6. In addition, like the sub-regions R03 and R04, in which both the first and second buses BUS_1, BUS_2 are placed, two or more buses may be placed in one sub-region.

The bus information extractor 210 of FIG. 3 may extract channel region information about sub-regions where a bus may be placed (e.g., the sub-regions R01 through R07 of FIG. 6), from the input data D100, and generate bus information including the channel region information. Hereinafter, as will be described with reference to FIGS. 7 through 9, channel region information extracted using the bus information extractor 210 may be used by the buffer array generator 230 in generating a buffer array, or by the buffer array placer 250 in placing a buffer array, or by the wiring procedure 270 in performing a wiring operation.

Figure 7:
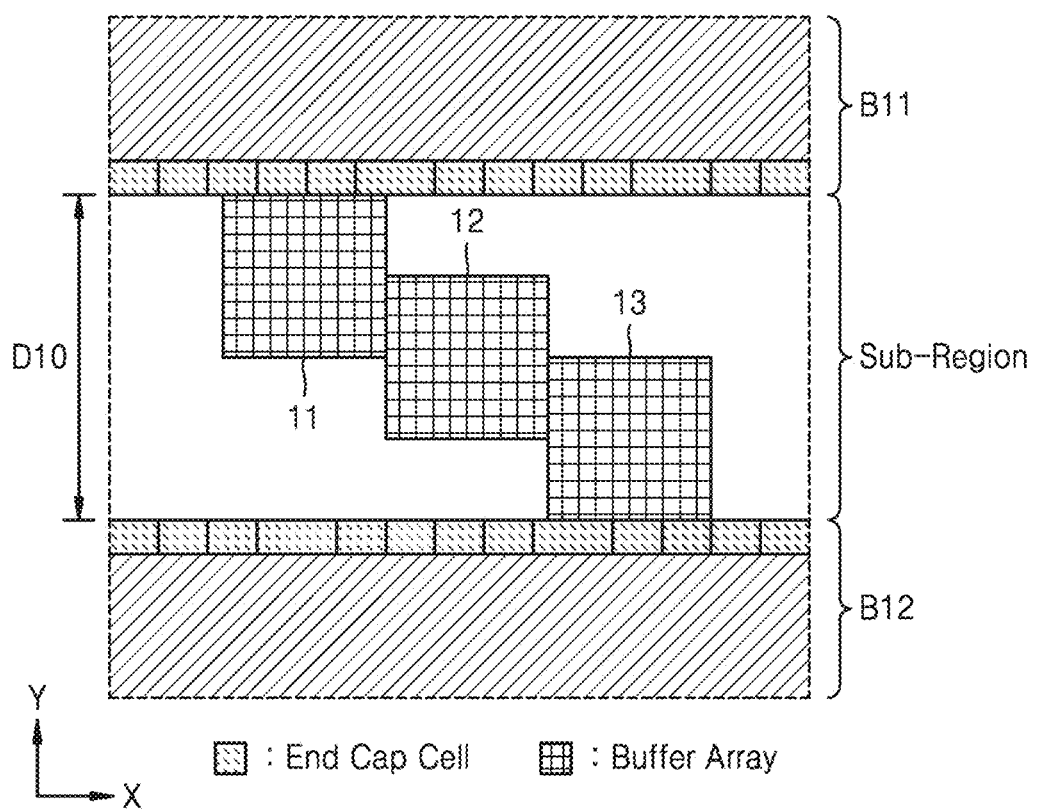
FIG. 7 is a schematic view of buffer arrays placed according to an example embodiment.

FIG. 7 is a schematic view of buffer arrays arranged according to an example embodiment. As described above, two or more buffers may be placed in one sub-region, and accordingly, two or more buffer arrays corresponding to different buffers may be placed in one sub-region. In FIG. 7, for convenience of illustration, interconnections connected to buffer arrays 11 through 13 are not illustrated, and the interconnections may be respectively connected to the buffer arrays 11 through 13 and extend in parallel to an X-axis direction.

Referring to FIG. 7, function blocks B11 and B12 may include end cap cells placed at edges of the function blocks B11 and B12. Accordingly, a sub-region may be a region between the end cap cells of the two function blocks B11 and B12. Accordingly, as illustrated in FIG. 7, a distance between the function blocks B11 and B12 may be a distance D10 between the end cap cells, and the distance D10 may be substantially equal to a width of the sub-region. Accordingly, in the example embodiment of FIG. 7, three buses extending in parallel to the X-axis direction may be within the distance D10.

According to the example embodiment, the buffer array placer 250 of FIG. 3 may place the buffer arrays 11 through 13 such that an overlapping area between interconnections connected to the buffer arrays 11 through 13 is reduced. For example, as illustrated in FIG. 7, the buffer arrays 11 through 13 may be spaced apart from each other as much as possible in a direction perpendicular to a direction in which the interconnections extend (X-axis direction), that is, in a Y-axis direction. Accordingly, the two buffer arrays 11 and 13 may be respectively placed near a boundary between a channel region and the function blocks B11 and B12, and the buffer array 12 may be placed around a middle portion of the channel region in the Y-axis direction.

Figure 8A:
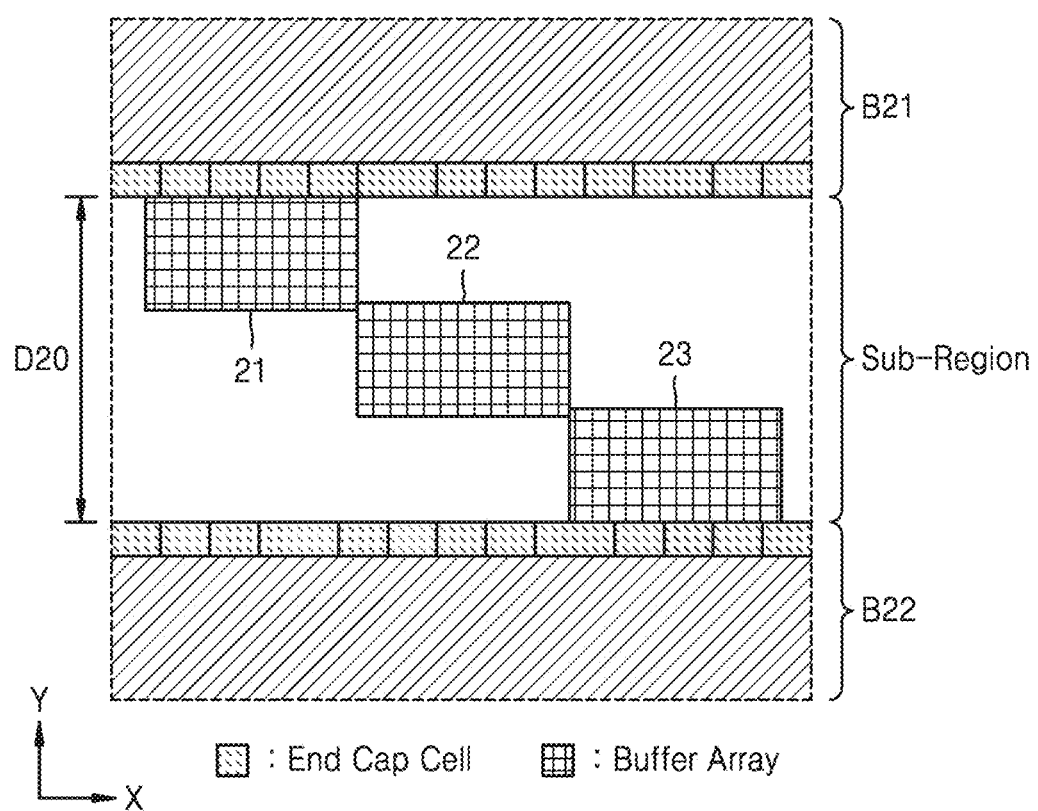
FIGS. 8A and 8B are schematic views of buffer arrays placed according to example embodiments.
Figure 8B:
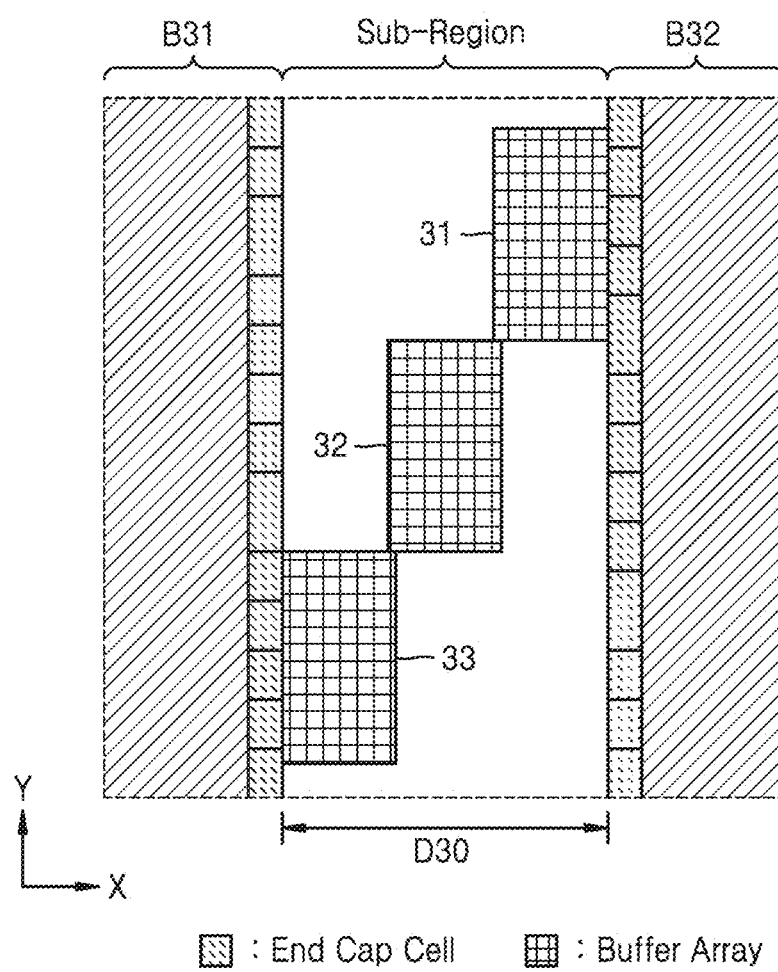

FIGS. 8A and 8B schematically illustrate examples of buffer arrays generated arranged according to an example embodiment. According to the example embodiment, the buffer array generator 230 may generate buffer arrays 21 through 23 such that an overlapping area between interconnections connected to the buffer arrays 21 through 23 is reduced. To this end, the buffer array generator 230 may generate buffer arrays included in buses, based on both information about a sub-region and bus information of buses in the sub-region.

Referring to FIG. 8A, the buffer arrays 21 through 23 may have a length that decreases in a Y-axis direction such that an overlapping area between interconnections extending in parallel to an X-axis direction is reduced. That is, compared with the buffer arrays 11 through 13 illustrated in FIG. 7, the buffer arrays 21 through 23 may have a greater length in the X-axis direction but a smaller length in the Y-axis direction. For example, the buffer array generator 230 may generate the buffer arrays 21 through 23 based on information about D20, which is both a distance between end cap cells of function blocks B21 and B22 and a width of a sub-region, and information about three buses, for example, information about the number of connections included in each bus.

Similarly, when referring to FIG. 8B, buffer arrays 31 through 33 may have a length that decreases in an X-axis direction such that an overlapping area between interconnections extending in parallel to a Y-axis direction is reduced. That is, compared with the buffer arrays 11 through 13 of FIG. 7, the buffer arrays 31 through 33 of FIG. 8B may have a greater length in the Y-axis direction but a smaller length in the X-axis direction. For example, the buffer array generator 230 may generate the buffer arrays 31 through 33 based on information about D30, which is both a distance between end cap cells of function blocks B31 and B32 and a width of a sub-region, and information about three buses, for example, information about the number of connections included in each bus.

Figure 9:
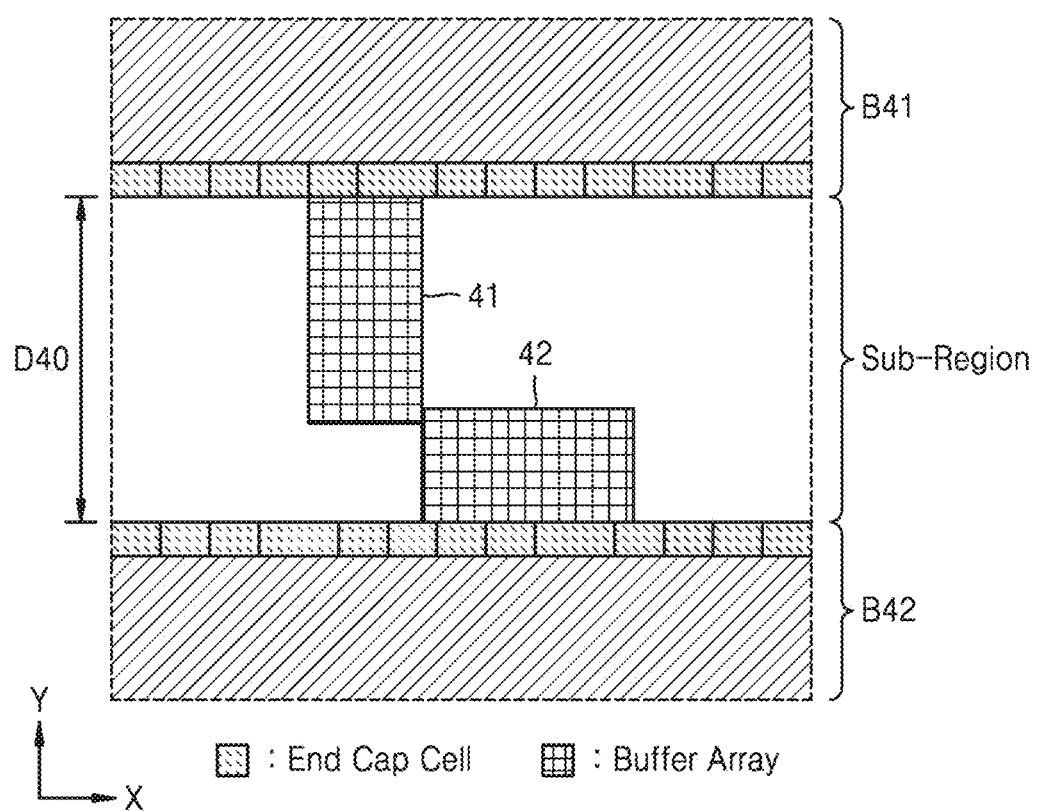
FIG. 9 is a schematic view of buffer arrays placed according to an example embodiment.

FIG. 9 is a schematic view of buffer arrays placed according to an example embodiment.

According to the example embodiment, each bus may have a priority, and bus information generated using the bus information extractor 210 of FIG. 3 may include priority information of the buses. For example, priorities of buses may be defined in the input data D100 of FIG. 3 extracted from the input data D100 by the bus information extractor 210, or the bus information extractor 210 may determine priorities of buses based on the input data D100. As described above with reference to FIG. 3, the input data D100 may include information about signals transmitted via a bus, and the bus information extractor 210 may determine a priority of a bus based on the information about the signals. For example, the bus information extractor 210 may set a higher priority to a bus through which a signal of a relatively high frequency is transmitted than a bus through which a signal of a relatively low frequency is transmitted. The buffer array generator 230 and the buffer array placer 250 of FIG. 3 may generate or place a buffer array based on priorities of buses included in bus information.

Referring to FIG. 9, two buses extending in parallel to an X-axis and including the same number of connections may be in a sub-region having a width D40. In the example embodiment of FIG. 9, the two buses may have different priorities, and a bus including a buffer array 41 may have a higher priority than a bus including a buffer array 42. A bus having a relatively high priority may be used, for example, for transmitting a signal having a relatively high frequency and/or a relatively low voltage level, the signal being more likely distorted by crosstalk between interconnections. In order to avoid signal distortion, a distance between interconnections respectively corresponding to connections of a bus, through which a signal of a relatively high frequency or a relatively low voltage level is transmitted, may be increased. Accordingly, a bus of a relatively high priority may have a relatively great width.

According to the example embodiment, the buffer array generator 230 of FIG. 3 may generate a buffer array such that a bus of a relatively high priority has a relatively great width. That is, the buffer array generator 230 may generate a buffer array such that a distance between interconnections included in a bus of a relatively high priority is relatively great. For example, as illustrated in FIG. 9, the buffer array 41 is included in the bus having a higher priority than the bus, in which the buffer array 42 is included, and a length of the buffer array 41 in the Y-axis direction may be greater than a length of the buffer array 42 in the Y-axis direction. Accordingly, interconnections connected to the buffer array 41 may be spaced apart from each other by a greater distance than interconnections connected to the buffer array 42.

Figure 10A:
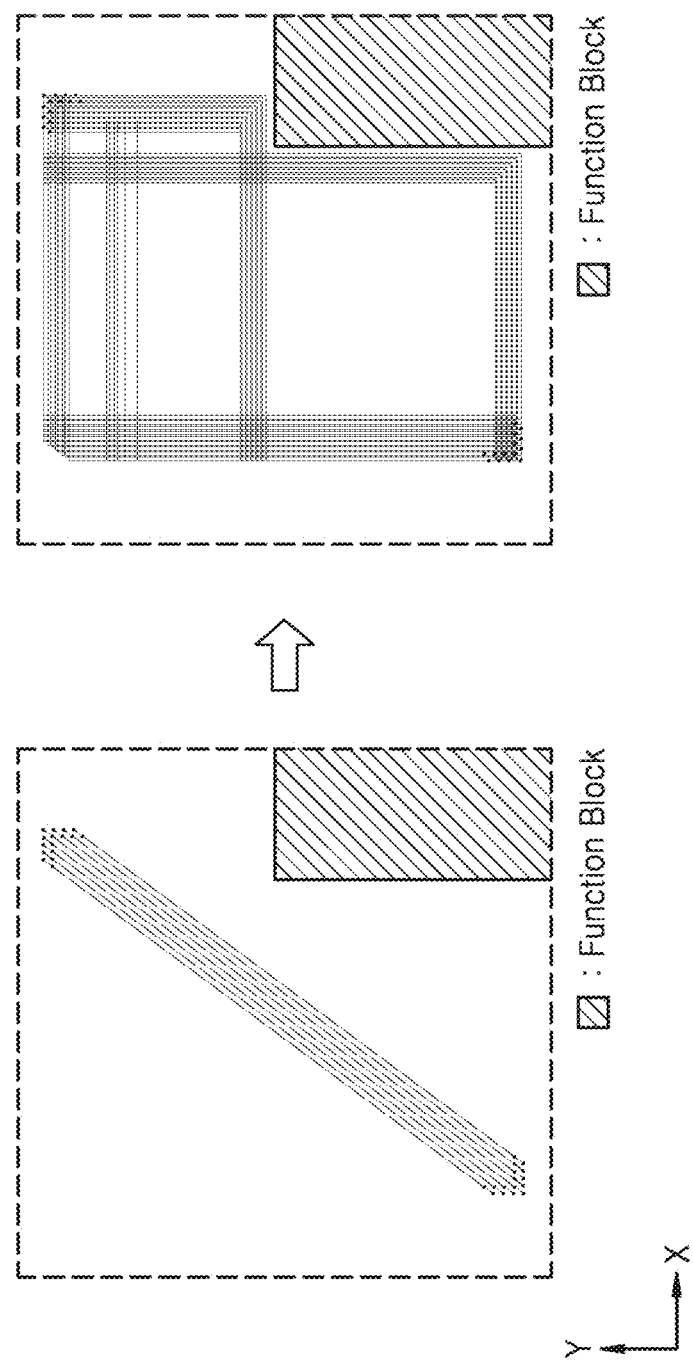
FIGS. 10A and 10B schematically illustrate examples of routed buses according to an example embodiment.
Figure 10B:
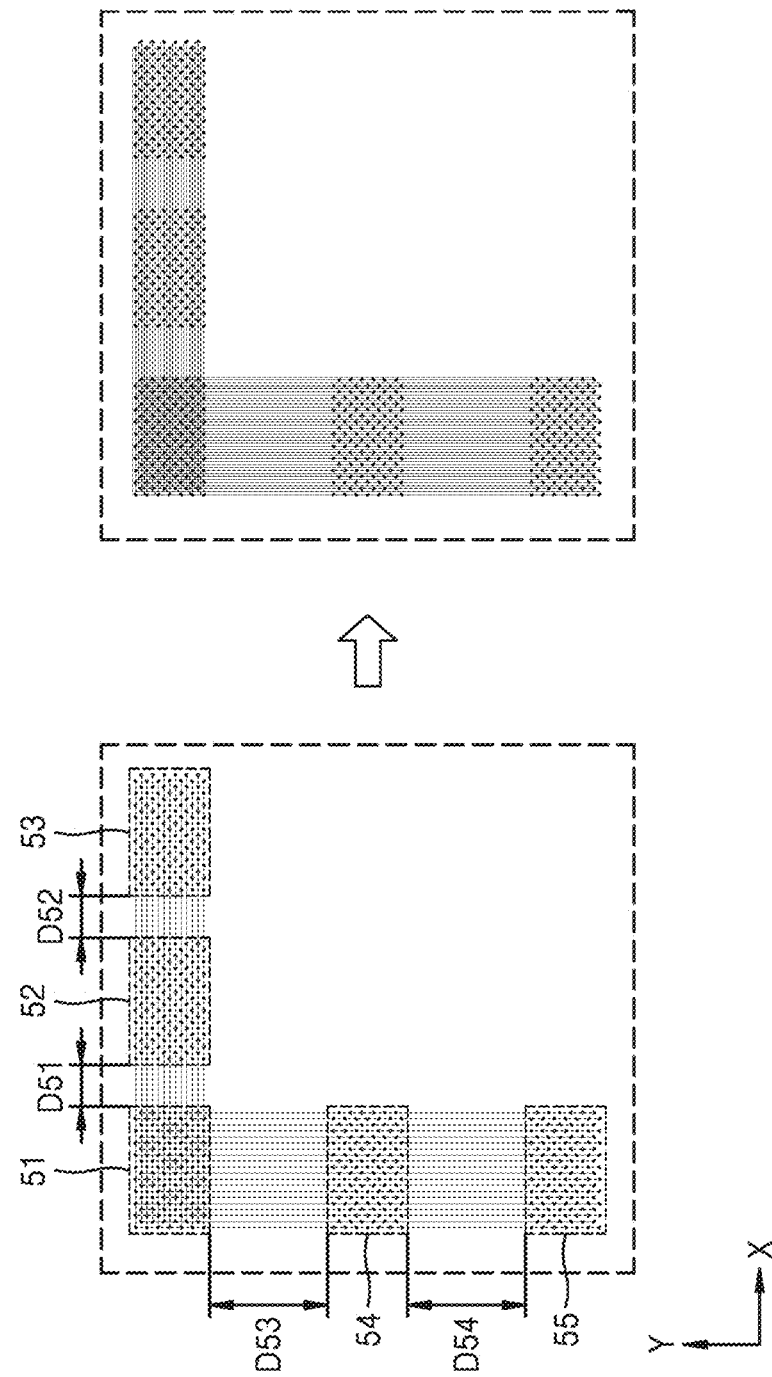

FIGS. 10A and 10B schematically illustrate examples of routed buses. In detail, FIG. 10A illustrates a bus in which connections included in the bus are individually routed, and FIG. 10B illustrates a bus that is routed by placing a buffer array based on quantified physical requirements of the bus, according to an example embodiment.

Referring to FIG. 10A, in order to connect pins at a left lower end and pins of a right upper end illustrated in the left plan view of FIG. 10A, a plurality of connections included in the bus may be individually routed as illustrated in the right plan view of FIG. 10A. Accordingly, as illustrated in the right plan view of FIG. 10A, connections included in one bus may not be uniformly routed, thereby increasing jitter of signals transmitted through the bus. In addition, as the number of points where interconnections respectively corresponding to the connections overlap one another (or cross one another) increases, signal distortion may be caused, and moreover, routing resources may be wasted.

Referring to FIG. 10B, as illustrated in the left plan view of FIG. 10B, based on bus information extracted using the bus information extractor 210, a plurality of buffer arrays 51 through 55 generated using the buffer array generator 230 may be placed using the buffer array placer 250. In the example embodiment illustrated in FIG. 10B, the buffer arrays 51 through 53 may be identical to each other.

According to an example embodiment, the buffer array placer 250 may place buffer arrays at uniform distances. For example, as illustrated in the left plane view of FIG. 10B, a distance D51 between adjacent buffer arrays 51 and 52 in an X-axis direction may be equal to a distance D52 between adjacent buffer arrays 52 and 53 in the X-axis direction. Similarly, a distance D53 between adjacent buffer arrays 51 and 54 in a Y-axis direction may be equal to a distance D54 between adjacent buffer arrays 54 and 55 in the Y-axis direction. The wiring procedure 270 of FIG. 3 may form a bus by generating interconnections connected to buffers included in the buffer arrays 51 through 55.

As illustrated in the right plan view of FIG. 10B, the interconnections respectively corresponding to the plurality of connections included in the bus may respectively uniformly extend in the Y-axis direction and the X-axis direction. Accordingly, jitter of signals transmitted through the bus may be reduced, and as the number of points where the interconnections are cross one another is reduced, routing resources may be efficiently used.

Figure 11:
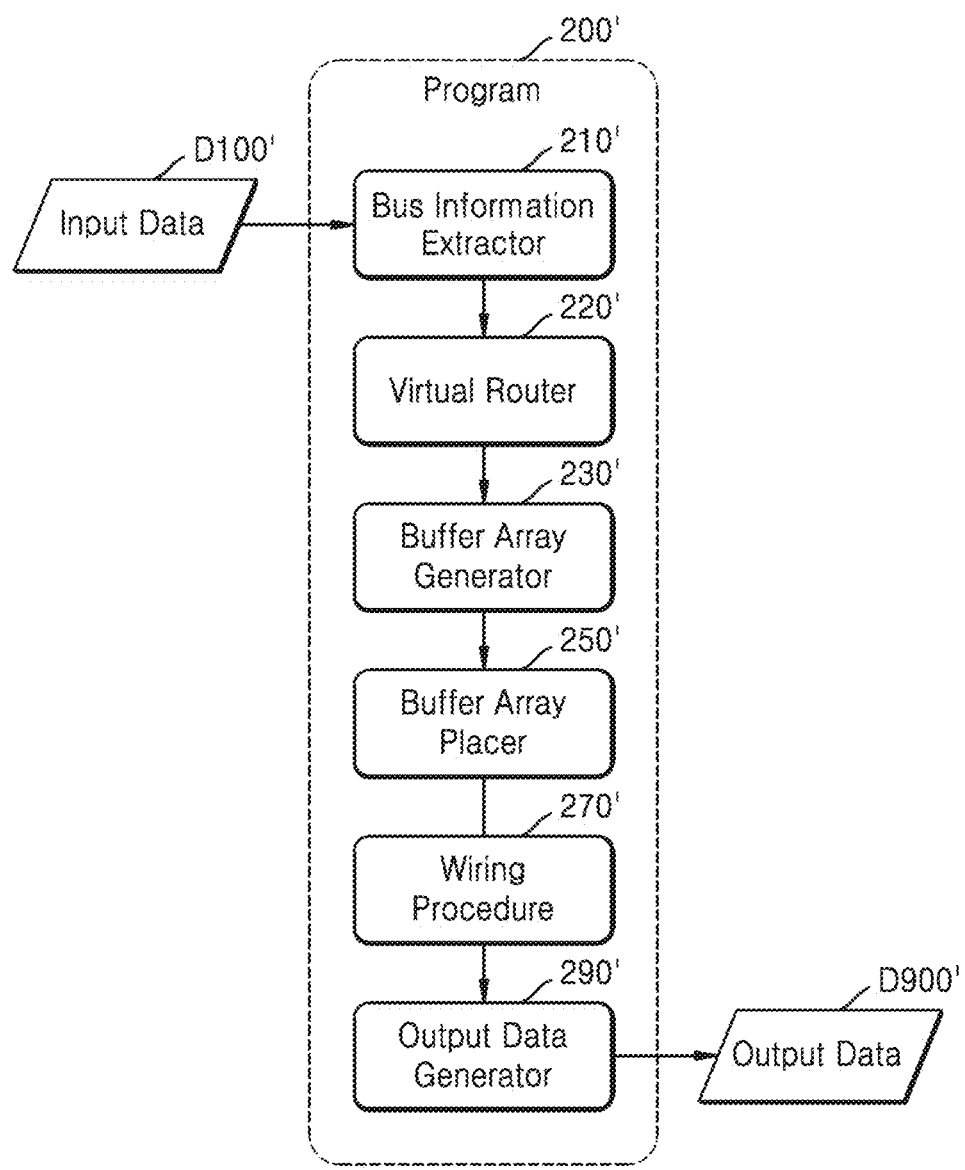
FIG. 11 is a block diagram of a program according to an example embodiment.
Figure 12:
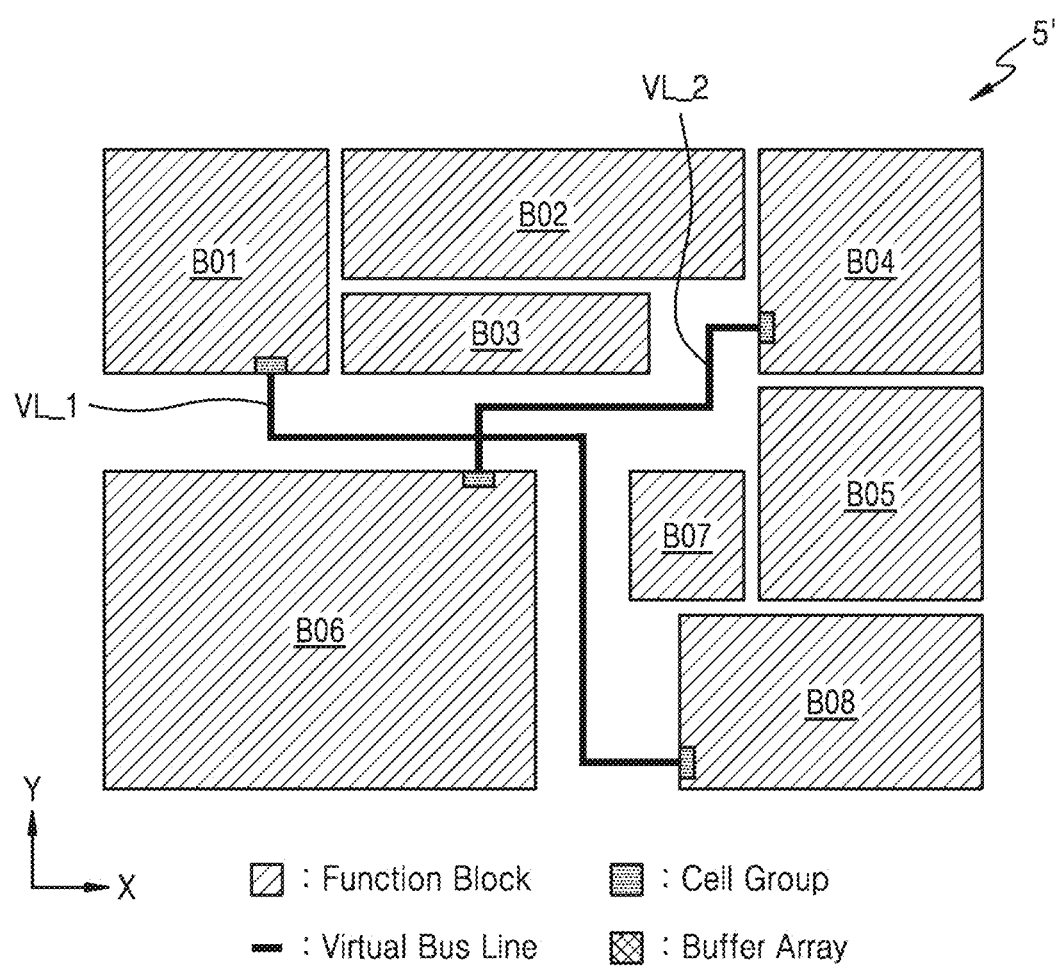
FIG. 12 is a schematic plan view of an integrated circuit, in which an operation of a virtual router included in a program of FIG. 11 according to an example embodiment is illustrated.

FIG. 11 is a block diagram of a program 200' according to an example embodiment. FIG. 12 is a schematic plan view of an integrated circuit 5', in which an operation of a virtual router 220' included in the program 200' of FIG. 11 according to an example embodiment is illustrated. Like the program 200 of FIGS. 1 and 3, the program 200' of FIG. 11 may be stored in a memory (for example, the RAM 140 of FIG. 1) and executed via the CPU 110. Compared with the program 200 of FIG. 3, the program 200' of FIG. 11 may further include the virtual router 220'. Procedures included in the program 200' of FIG. 11 may perform the same or similar operations as the corresponding procedures included in the program 200 of FIG. 3.

Referring to FIG. 11, according to the example embodiment, the virtual router 220' may generate a virtual bus line. For example, a bus information extractor 210' may generate a virtual bus line connecting a starting point and an arrival point of a bus based on bus information extracted by the bus information extractor 210' from the input data D100'. The virtual bus line may be used in guiding a location where a buffer array and interconnections are placed. For example, as illustrated in FIG. 12, the virtual router 220' may generate a first virtual bus line VL_1 connecting a cell group included in a function block B01 and a cell group of a function block B08. In addition, the virtual router 220' may generate a virtual bus line VL_2 connecting a cell group included in a function block B04 and a cell group included in a function block B06.

According to an example embodiment, the virtual router 220' may generate a virtual bus line such that an overlapping area between buses is minimized. For example, the virtual router 220' may calculate a width of each bus based on the number of connections included in each bus, and generate a virtual bus line based on the calculated width. A virtual bus line may have a calculated width of a bus, or a virtual bus line corresponding to a central line of a bus may be generated.

Based on the virtual bus line generated by using the virtual router 220', a buffer array generator 230' may generate a buffer array, and a buffer array placer 250' may place the buffer array. For example, the buffer array generator 230' may generate a buffer array based on a virtual bus line of a bus including the buffer array and another virtual bus line placed in a sub-region. That is, the buffer array generator 230' may recognize buses placed in a sub-region based on virtual bus lines corresponding to two or more buses, and generate buffer arrays respectively included in a plurality of buses in the sub-region, in which a plurality of buses are placed, as described above, for example, with reference to FIGS. 7 through 9. In addition, the buffer array placer 250' may place a buffer array on a virtual bus line. For example, as described above with reference to FIG. 10B, the buffer array placer 250' may place a buffer array at a turning point of a virtual bus line, or place a series of buffer arrays in an X-axis direction or a Y-axis direction at equal distances.

Figure 13A:
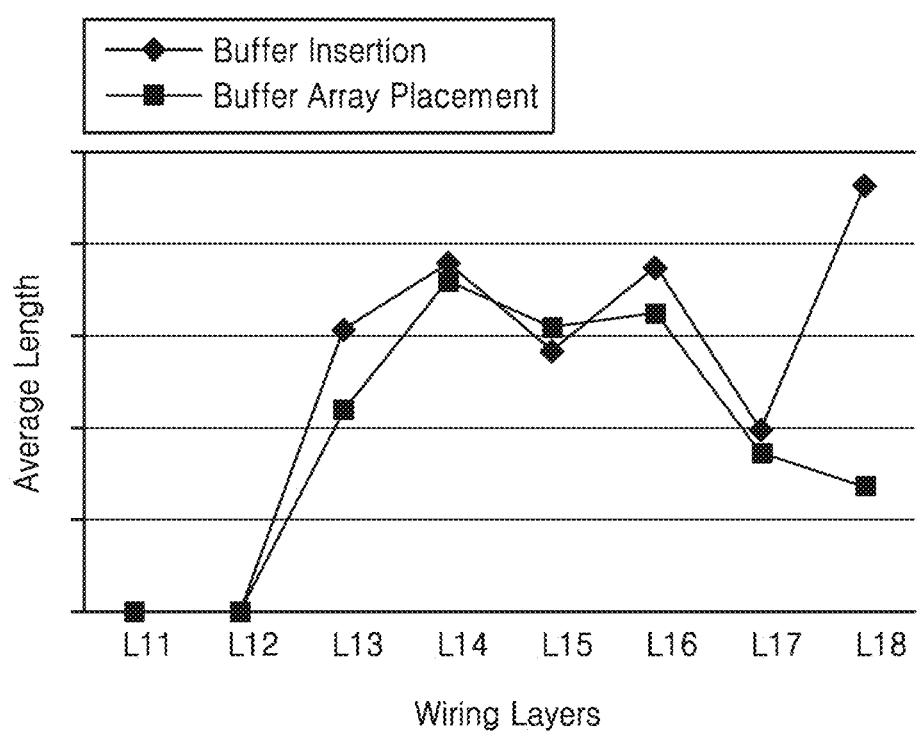
FIGS. 13A and 13B are graphs showing routing resources used when routing a bus according to example embodiments.
Figure 13B:
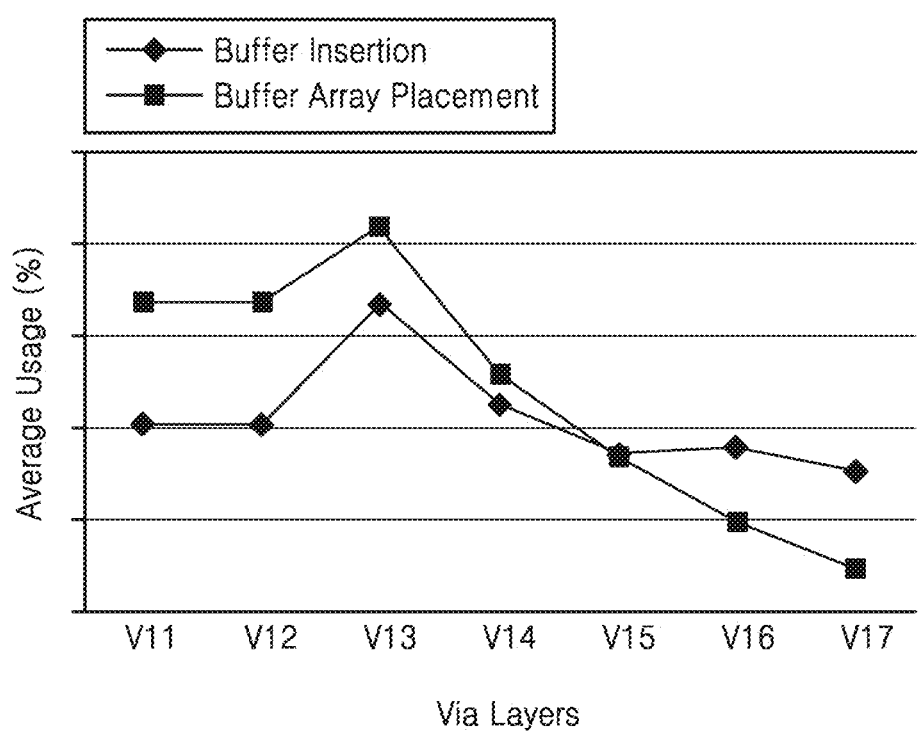

FIGS. 13A and 13B are graphs showing routing resources used when routing a bus according to example embodiments. In detail, FIG. 13A illustrates average lengths of patterns respectively formed in wiring layers L11 through L18, used to form a bus, and FIG. 13B illustrates a ratio of average numbers of vias V11 through V17 formed at different levels, which are used to form a bus.

Referring to FIG. 13A, the graph of FIG. 13A shows that a bus that is routed by generating a buffer array according to an example embodiment, has a shorter pattern lengths than a bus in which connections included in the bus are individually routed. That is, the bus routed according to the example embodiment may have a reduced length, and accordingly, not only the connections included in the bus are uniformly routed but delay of signals transmitted through the bus may also be reduced. In addition, as the length of patterns is reduced, a section where a signal is exposed to crosstalk via the patterns may also be reduced.

Referring to FIG. 13B, a bus routed by generating a buffer array according to the example embodiment includes a reduced number of vias. However, a relatively greater number of vias at some levels may be used from among the vias at a plurality of different levels. That is, the graph of FIG. 13B shows that, while a plurality of vias at different levels are uniformly used in the bus in which connections are individually routed, whereas in the bus routed according to the example embodiment, vias of some levels (for example, the vias V11 through V14 of FIG. 13B) from among the different levels are used relatively more frequently. Referring to the graph of FIG. 13B, it is evident that, when a plurality of interconnections overlap with one another, vias of multiple different levels are used, and thus, in the bus routed according to the example embodiment, an overlapping area between interconnections corresponding to connections included in the bus or between interconnections of different buses is reduced. That is, crosstalk between and via resistance of signals transmitted through the bus routed according to the example embodiment may be reduced.

Figure 14:
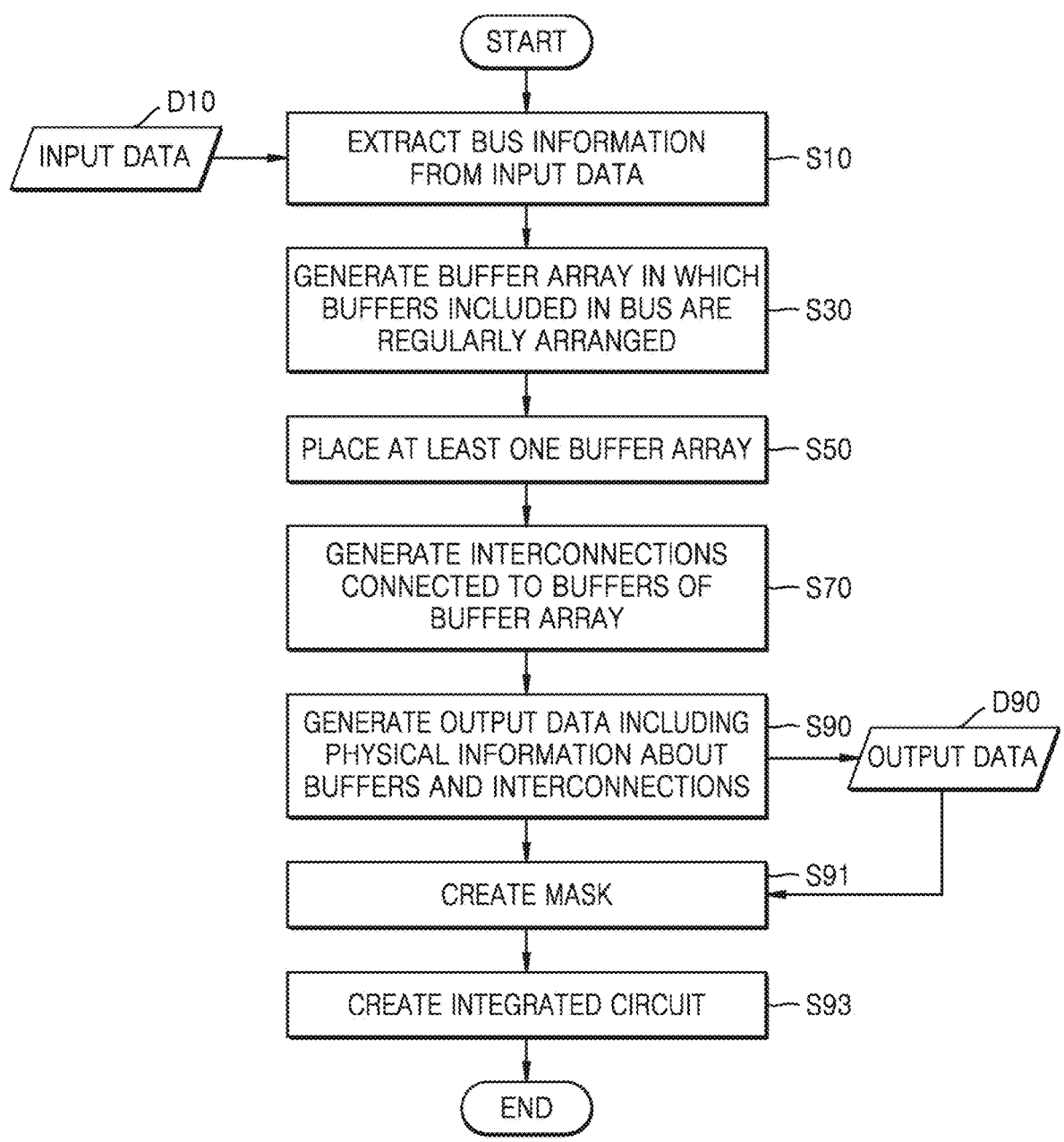
FIG. 14 is a flowchart of a method of routing a bus according to an example embodiment.

FIG. 14 is a flowchart illustrating a method of routing a bus according to an example embodiment. As illustrated in FIG. 14, the bus routing method may include a plurality of operations S10, S30, S50, S70, S90, S91 and S93. For example, the operations S10, S30, S50, S70 and S90 of FIG. 14 may be performed as the CPU 110 of the computing system 100 of FIG. 1 executes the program 200 of FIG. 3, and the bus routing method will be described below also with reference to FIG. 3.

Referring to FIG. 14, in operation S10, an operation of extracting bus information from the input data D10 may be performed. For example, as described above, the input data D10 may include information for routing a bus in an integrated circuit, and the bus information extractor 210 may extract bus information including physical requirements for a bus, from the input data D10. The physical requirements may include, for example, information about a starting point and an arrival point of a bus, channel region information about a channel region about an area where the bus may be placed, or information about a signal that is transmitted through the bus. Preferences for routing a bus may be quantified based on the bus information extracted using the bus information extractor 210, and the bus information may provide a basis for subsequent operations of the method.

In operation S30, an operation of generating a buffer array in which buffers included in the bus are regularly arranged may be performed. For example, the buffer array generator 230 may generate a buffer array in which buffers are regularly spaced, based on bus information extracted using the bus information extractor 210. The buffer array may include buffers of the same number as the numbers of connections included in the bus, and types of buffers included in the buffer array and/or a configuration of the buffer array may be pre-set based on the bus information, or may be determined based on physical requirements included in the bus information by using the buffer array generator 230. In addition, buffer arrays included in the bus may be different or identical.

In operation S50, an operation of placing at least one buffer array may be performed. For example, the buffer array placer 250 may place at least one buffer array generated using the buffer array generator 230, in a layout of an integrated circuit. The buffer array may be placed at a turning point of the bus and such that adjacent buffer arrays are arranged at uniform distances. In addition, the buffer array may be placed by considering buffer arrays of other buses and such that an overlapping area with other buses is minimized.

In operation S70, an operation of generating interconnections connected to buffers of the buffer array may be performed. For example, the wiring procedure 270 may generate interconnections connected to buffers included in at least one buffer array placed using the buffer array placer 250. As described above with reference to FIGS. 13A and 13B, the interconnections generated according to the example embodiment may include patterns having a reduced length and a reduced number of vias.

In operation S90, an operation of generating output data D90 including physical information about buffers and interconnections may be performed. For example, the output data D90 may include names of standard cells corresponding to the buffers and coordinates information of the buffers and information indicating layouts of the buffers and the interconnections. The output data D90 may be used in implementing a bus in a semiconductor process.

In operation S91, an operation of creating a mask may be performed. For example, at least one mask may be manufactured according to the output data D90 to construct the buffers and the interconnections in the integrated circuit. The at least one mask may be manufactured based on the physical information about buffers and interconnections included in the output data D90.

In operation S93, an operation of creating the integrated circuit may be performed. For example, the integrated circuit may be fabricated in the semiconductor process by using the at least one mask which may be manufactured in operation S91. Therefore, the integrated circuit may include structures corresponding to the buffers and the interconnections defined in the output data D90.

Figure 15:
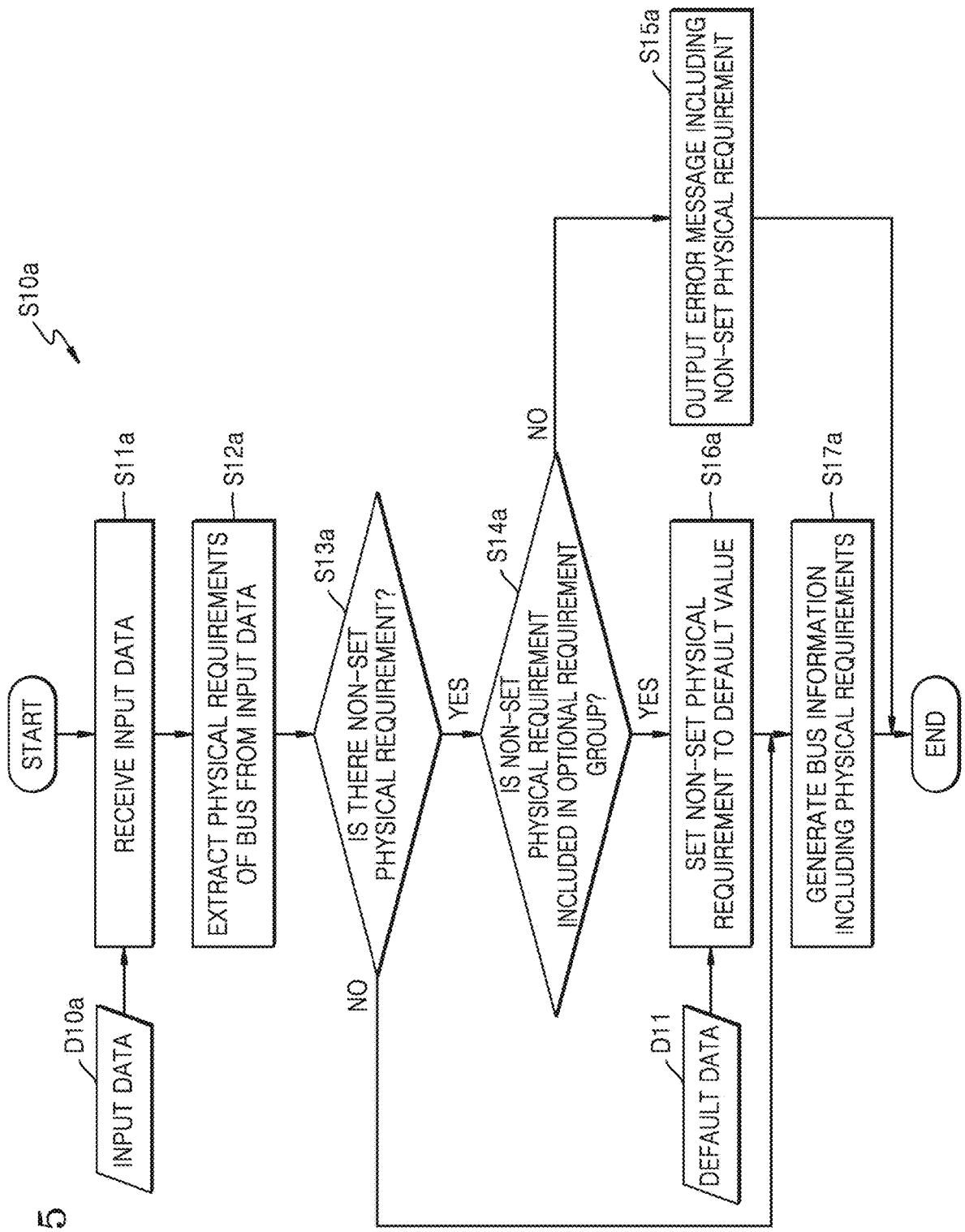
FIGS. 15 and 16 are flowcharts of examples of operation S10 of FIG. 14 according to example embodiments.
Figure 16:
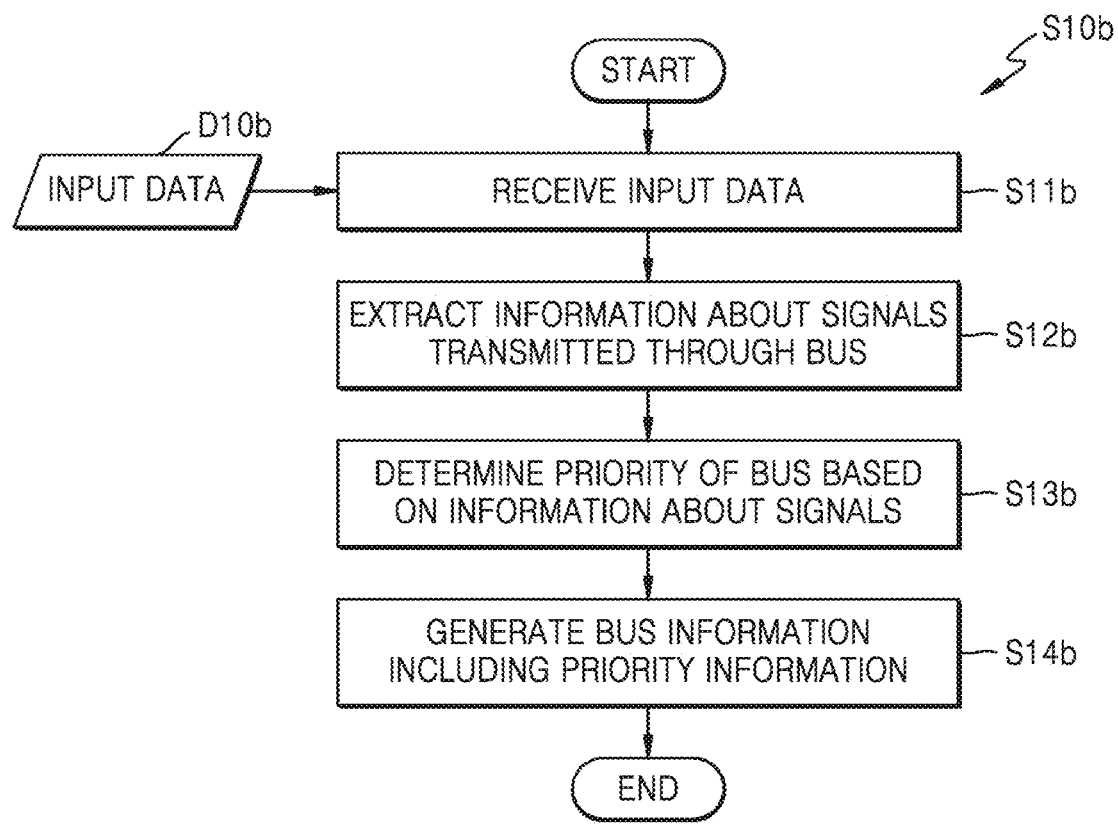

FIGS. 15 and 16 are flowcharts of example operations S10a and S10b of operation S10 of FIG. 14 according to example embodiments. As described above with reference to FIG. 14, in operation S10, an operation of extracting bus information from input data D10 may be performed. According to the example embodiments, operations illustrated in FIGS. 15 and 16 may be performed using the bus information extractor 210 of FIG. 3.

Referring to FIG. 15, in operation S11a, an operation of receiving input data D10a may be performed. For example, the storage device 160 of FIG. 1 may store the input data D10a, and the bus information extractor 210 may load the input data D10a stored in the storage device 160 to the RAM 140. The input data D10a may also be received via the input/output devices 120 or the network interface 130 of FIG. 1, and the bus information extractor 210 may load the received input data D10a to the RAM 140.

In operation S12a, an operation of extracting physical requirements of a bus from the input data D10a may be performed. As described above with reference to FIG. 4, the physical requirements may include a requirement group G1 and an optional requirement group G2. A list of physical requirements included in the requirement group G1 and the optional requirement group G2 may be predefined, and the bus information extractor 210 may extract physical requirements from the input data D10a based on the list of the predefined physical requirements, and set values of the physical requirements.

In operation S13a, an operation of determining whether non-set physical requirement exists may be performed. That is, whether physical requirements that are not set based on the input data D10a exist may be determined. If there is no non-set physical requirement, an operation of generating bus information including physical requirements may be performed in operation S17a. On the other hand, if there is non-set physical requirement, in operation S14a, an operation of determining whether the non-set physical requirement is included in an optional requirement group (for example, the optional requirement group G2 of FIG. 4) may be performed.

In operation S14a, when a non-set physical requirement is determined as not being included in the optional requirement group, an operation of outputting an error message including the non-set physical requirement may be performed in operation S15a. That is, if physical requirements included in a requirement group are not set from the input data 10a, subsequent operations (for example, operations S30, S50, S70, and S90 of FIG. 14) may not be performed, and thus, the bus information extractor 210 may output an error message, for example, via the input/output devices 120 of FIG. 1.

In operation S14a, when a non-set physical requirement is determined as being included in the optional requirement group, in operation S16a, an operation of setting the non-set physical requirement to a default value based on the default data D11 may be performed. As described above with reference to FIG. 4, the default data D11 defining default values of the physical requirements may be prepared in advance, and based on the default data D11, the bus information extractor 210 may set a physical requirement that is included in an optional requirement group and is not set, to a default value. Next, in operation S17a, an operation of generating bus information including the physical requirements may be performed, and the bus information may include the physical requirement set to the default value.

Referring to FIG. 16, in operation S11b, an operation of receiving input data D10b may be performed. Next, in operation S12b, an operation of extracting information about signals transmitted through a bus may be performed. For example, the input data D10b may include information about a signal transmitted via a bus, for example, a voltage level, a frequency, and a rising time and a falling time of a signal. The bus information extractor 210 may extract information about the signal from the input data D10b.

In operation S13b, an operation of determining a priority of a bus may be performed based on information about signals. A priority of a bus may refer to a significance of the bus with respect to other buses. That is, based on information about signals, the bus information extractor 210 may determine priorities of buses. Thus, a bus, through which a signal that is more likely distorted is transmitted, may be determined to have a higher priority. Also, a bus through which a signal of a relatively high frequency or of a relatively low voltage level is transmitted may be determined to have a relatively high priority.

In operation S14b, an operation of generating bus information including priority information may be performed. The priority information included in the bus information may be used, for example, by the buffer array generator 230 of FIG. 3 in generating a buffer array, as described above with reference to FIG. 9. A buffer array included in a buffer having a relatively high priority may be generated such that interconnections corresponding to connections are arranged at relatively great distances.

Figure 17:
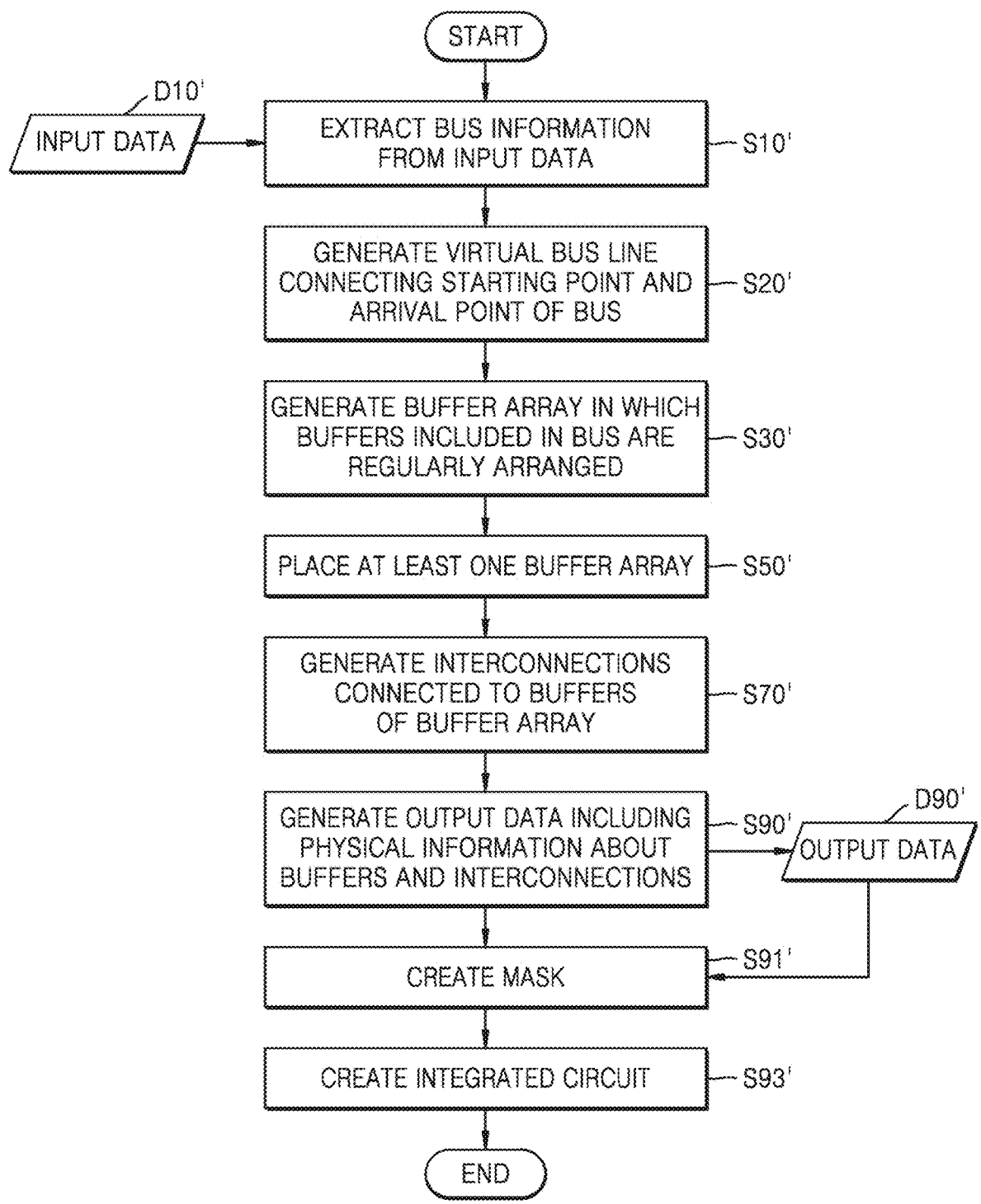
FIG. 17 is a flowchart of a method of routing a bus according to an example embodiment.

FIG. 17 is a flowchart of a method of routing a bus according to an example embodiment. As illustrated in FIG. 17, the bus routing method may include a plurality of operations S10', S20', S30', S50', S70', S90', S91', and S93'. For example, the operations S10', S20', S30', S50', S70' and S90' of FIG. 17 may be performed as the CPU 110 of the computing system 100 of FIG. 1 executes the program 200' of FIG. 11. and the bus routing method will be described below also with reference to FIG. 11.

Compared with the bus routing method of FIG. 14, the bus routing method of FIG. 17 may further include operation S20'. That is, after operation S10', in which bus information is extracted from the input data D10', in operation S20', an operation of generating a virtual bus line connecting a starting point and an arrival point of a bus may be performed. As described above with reference to FIGS. 11 and 12, the virtual bus line may guide locations where a buffer array and interconnections are placed. For example, the virtual router 220' of FIG. 11 may generate a virtual bus line connecting a starting point and an arrival point of a bus based on bus information about a plurality of buses. The virtual router 220' may generate a virtual bus line such that an overlapping area between buses is minimized, based on the bus information. For example, the virtual bus line may have a width of a bus calculated using the virtual router 220' based on the number of connections included in the bus, and the virtual router 220' may place the virtual bus line based on the width of the virtual bus line.

In operation S30', an operation of generating a buffer array, in which buffers included in the bus are regularly arranged, may be performed based on the bus information and the virtual bus line, and in operation S50', an operation of placing at least one buffer array may be performed based on the bus information and the virtual bus line. Next, in operation S70', an operation of generating interconnections connected to buffers of the buffer array may be performed based on the bus information and the virtual bus line, and in operation S90', an operation of generating output data D90' including physical information about the buffers and the interconnections may be performed. In operation S91', an operation of creating at least one mask based on the output data D90', and in operation S93', an operation of fabricating the integrated circuit may be performed according to the at least one mask.

While the inventive concepts have been particularly shown and described with reference to example embodiments thereof and using specific terms, these example embodiments are provided so that this disclosure will fully convey the inventive concepts, and not for purposes of limitation. Thus, it will be obvious to one of ordinary skill in the art that various changes and other equivalents may be made therein. Therefore, the scope of the inventive concepts is defined not by the detailed description but by the appended claims.

What is claimed is:

1. A method of routing a bus including a buffer in a layout of an integrated circuit, the method comprising:
    extracting bus information including physical requirements of the bus from input data;
    generating at least one buffer array in which buffers included in the bus are regularly arranged, based on the bus information;
    placing the at least one buffer array in the layout of the integrated circuit, based on the bus information;
    generating interconnections connected to buffers included in the at least one buffer array, based on the bus information; and
    generating a virtual bus line connecting a starting point and an arrival point of the bus based on a physical requirement for the starting point and the arrival point of the bus,
    wherein the generating of the at least one buffer array comprises generating the at least one buffer array based on the virtual bus line.

2. The method of claim 1, wherein
    the physical requirements include a requirement group and an optional requirement group, and
    the extracting of bus information comprises,
    extracting physical requirements of the bus from the input data;
    determining whether a non-set physical requirement is included in the optional requirement group, from among the physical requirements of the bus;
    setting the non-set physical requirement to a default value; and
    generating bus information including the physical requirements to the default value.

3. The method of claim 1, wherein
    the bus information includes first and second bus information about first and second buses, respectively, and
    the extracting of the bus information comprises,
    extracting information about signals transmitted through the first and second buses;
    determining priorities of the first and second buses based on the information about signals; and
    generating the first and second bus information respectively including the priorities of the first and second buses.

4. The method of claim 1, wherein
    the bus information includes first and second bus information about first and second buses, respectively, and
    the generating of the at least one buffer array comprises determining configurations of first and second buffer arrays such that an overlapping area between first interconnections connected to buffers included in the first buffer array of the first bus and second interconnections connected to buffers included in the second buffer array of the second bus is minimized.

5. The method of claim 1, wherein
    the bus information includes first and second bus information about first and second buses, respectively, and
    the placing of the at least one buffer array comprises placing first and second buffer arrays such that an overlapping area between first interconnections connected to buffers included in the first buffer array of the first bus and second interconnections connected to buffers included in the second buffer array of the second bus is minimized.

6. The method of claim 1, wherein
    the physical requirements includes a physical requirement for a starting point and an arrival point of the bus, and
    the placing of the at least one buffer array comprises,
    placing a first buffer array at a turning point of the bus, based on the bus information;
    placing at least one second buffer array at uniform distances between the starting point and the first buffer array; and
    placing at least one third buffer array at uniform distances between the arrival point and the first buffer array.

7. The method of claim 1, wherein
    the generating of the at least one buffer array comprises generating a buffer array in which adjacent buffers are aligned in a first direction.

8. The method of claim 1, wherein
    the generating of the at least one buffer array comprises generating a buffer array including in which buffers are aligned in a first direction and a second direction perpendicular to the first direction.

9. The method of claim 1, further comprising:
    generating output data including physical information about the at least one buffer array and the interconnections;
    creating at least one mask according to the output data; and
    creating the integrated circuit according to the at least one mask.

10. A method of generating a layout of an integrated circuit, the method comprising:
    generating input data by placing at least one function block in the layout; and
    routing a bus including at least one buffer, based on the input data, wherein
    the routing of the bus comprises:
    extracting bus information including physical requirements of the bus from the input data; and
    generating at least one buffer array and interconnections connected to the at least one buffer, based on the bus information, wherein
    the physical requirements includes a physical requirement for a starting point and an arrival point of the bus,
    the routing of the bus further comprises placing the at least one buffer array in the layout, and
    the placing of the at least one buffer array comprises,
    placing a first buffer array at a turning point of the bus, based on the bus information;

placing at least one second buffer array at uniform distances between the starting point and the first buffer array; and placing at least one third buffer array at uniform distances between the arrival point and the first buffer array.

11. The method of claim 10, wherein
the generating of the at least one buffer array and interconnections comprises generating a buffer array in which adjacent buffers are aligned in a first direction.

12. The method of claim 10, wherein
the generating of the at least one buffer array and interconnections further comprises generating a buffer array including in which buffers are aligned in a first direction and a second direction perpendicular to the first direction.

13. The method of claim 10, further comprising:
generating output data including physical information about the at least one buffer array and the interconnections;

creating at least one mask according to the output data; and creating the integrated circuit according to the at least one mask.

14. A method of routing a bus including a buffer in a layout of an integrated circuit, the method comprising:
extracting bus information including physical requirements of the bus from input data;

generating at least one buffer array based on the bus information;

placing the at least one buffer array in the layout such that a first buffer array is placed at a turning point of the bus, based on the bus information; and generating interconnections connected to buffers included in the at least one buffer array, based on the bus information, wherein the physical requirements includes a physical requirement for a starting point and an arrival point of the bus, and the placing of the at least one buffer array comprises,
placing at least one second buffer array at uniform distances between the starting point and the first buffer array; and placing at least one third buffer array at uniform distances between the arrival point and the first buffer array.

15. The method of claim 14, wherein
the generating of the at least one buffer array comprises generating a buffer array in which adjacent buffers are aligned in a first direction.

16. The method of claim 15, wherein
the generating of the at least one buffer array further comprises generating a buffer array including in which buffers are aligned in a first direction and a second direction perpendicular to the first direction.

17. The method of claim 14, further comprising:
generating output data including physical information about the at least one buffer array and the interconnections;

creating at least one mask according to the output data; and creating the integrated circuit according to the at least one mask.

* * * * *